(12) United States Patent
Fukuo et al.

(10) Patent No.: US 10,256,167 B1
(45) Date of Patent: Apr. 9, 2019

(54) HYDROGEN DIFFUSION BARRIER STRUCTURES FOR CMOS DEVICES AND METHOD OF MAKING THE SAME

(71) Applicant: SANDISK TECHNOLOGIES LLC, Plano, TX (US)

(72) Inventors: Noritaka Fukuo, Yokkaichi (JP); Hokuto Kodate, Yokkaichi (JP); Eiichi Fujikura, Yokkaichi (JP); Akinori Yutani, Yokkaichi (JP); Kengo Miura, Yokkaichi (JP); Masaomi Koizumi, Yokkaichi (JP); Hidehito Koseki, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/933,947

(22) Filed: Mar. 23, 2018

(51) Int. Cl.
*H01L 23/31* (2006.01)
*H01L 21/765* (2006.01)
(Continued)

(52) U.S. Cl.
CPC ...... *H01L 23/3192* (2013.01); *H01L 21/0217* (2013.01); *H01L 21/02164* (2013.01); *H01L 21/31053* (2013.01); *H01L 21/56* (2013.01); *H01L 21/761* (2013.01); *H01L 21/765* (2013.01); *H01L 21/76895* (2013.01); *H01L 21/8238* (2013.01); *H01L 23/535* (2013.01); *H01L 23/564* (2013.01); *H01L 27/092* (2013.01); *H01L 27/11526* (2013.01); *H01L 27/11556* (2013.01); *H01L 27/11573* (2013.01); *H01L 27/11582* (2013.01);
(Continued)

(58) Field of Classification Search
CPC ............. H01L 23/3192; H01L 21/76895
See application file for complete search history.

(56) References Cited

U.S. PATENT DOCUMENTS 5,915,167 A 6/1999 Leedy
8,765,585 B2 * 7/2014 Fan ................ H01L 21/823418
257/E21.49
(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — William Coleman
(74) *Attorney, Agent, or Firm* — The Marbury Law Group PLLC

(57) ABSTRACT

A semiconductor structure includes a field effect transistor located on a semiconductor substrate, a silicon oxide liner contacting at least a portion of the semiconductor substrate, a silicon nitride liner contacting a top surface and a sidewall of the silicon oxide liner and contacting a top surface of the semiconductor substrate in a seal region, a silicon nitride diffusion barrier layer including a planar bottom surface that contacts top surfaces of vertically extending portions of the silicon nitride liner, and a silicon oxide material portion overlying the silicon nitride diffusion barrier layer. A combination of the silicon nitride liner and the silicon nitride diffusion barrier layer constitutes a hydrogen diffusion barrier structure that continuously extends from the seal region and over the field effect transistor.

21 Claims, 42 Drawing Sheets

(51) Int. Cl.
*H01L 21/761* (2006.01)
*H01L 27/11582* (2017.01)
*H01L 27/11556* (2017.01)
*H01L 27/11573* (2017.01)
*H01L 27/11526* (2017.01)
*H01L 29/06* (2006.01)
*H01L 23/00* (2006.01)
*H01L 27/092* (2006.01)
*H01L 23/535* (2006.01)
*H01L 29/51* (2006.01)
*H01L 29/40* (2006.01)
*H01L 21/8238* (2006.01)
*H01L 21/56* (2006.01)
*H01L 21/02* (2006.01)
*H01L 21/3105* (2006.01)
*H01L 21/768* (2006.01)

(52) U.S. Cl.
CPC ...... *H01L 29/0646* (2013.01); *H01L 29/0653* (2013.01); *H01L 29/402* (2013.01); *H01L 29/518* (2013.01)

(56) References Cited

U.S. PATENT DOCUMENTS

| | | | |
|---|---|---|---|
| 8,847,302 B2 | 9/2014 | Alsmeier et al. | |
| 9,559,117 B2 * | 1/2017 | Pachamuthu | H01L 29/665 |
| 9,570,463 B1 | 2/2017 | Zhang et al. | |
| 10,115,681 B1 * | 10/2018 | Ariyoshi | H01L 23/564 |
| 2017/0373079 A1 * | 12/2017 | Sharangpani | H01L 27/11556 |
| 2017/0373197 A1 * | 12/2017 | Sharangpani | H01L 29/7883 |

OTHER PUBLICATIONS

U.S. Appl. No. 15/418,989, filed Jan. 30, 2017, SanDisk Technologies LLC.
U.S. Appl. No. 15/434,544, filed Feb. 16, 2017, SanDisk Technologies LLC.
U.S. Appl. No. 15/458,200, filed Mar. 14, 2017, SanDisk Technologies LLC.
U.S. Appl. No. 15/458,269, filed Mar. 14, 2017, SanDisk Technologies LLC.
U.S. Appl. No. 15/458,272, filed Mar. 14, 2017, SanDisk Technologies LLC.
U.S. Appl. No. 15/581,575, filed Apr. 28, 2017, SanDisk Technologies LLC.
U.S. Appl. No. 15/593,916, filed May 12, 2017, SanDisk Technologies LLC.
U.S. Appl. No. 15/605,204, filed May 25, 2017, SanDisk Technologies LLC.
U.S. Appl. No. 15/638,672, filed Jun. 30, 2017, SanDisk Technologies LLC.
U.S. Appl. No. 15/863,205, filed Jan. 5, 2018, SanDisk Technologies LLC.

* cited by examiner

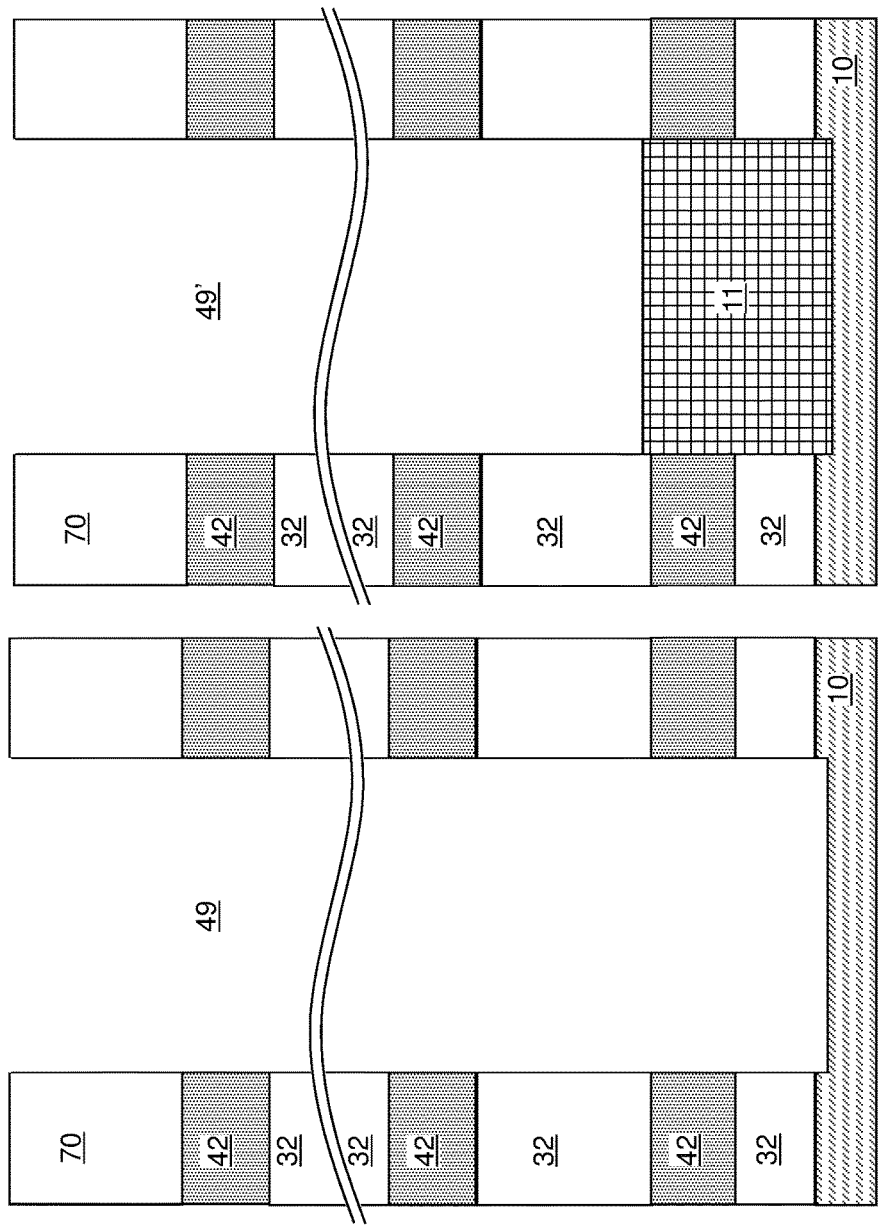

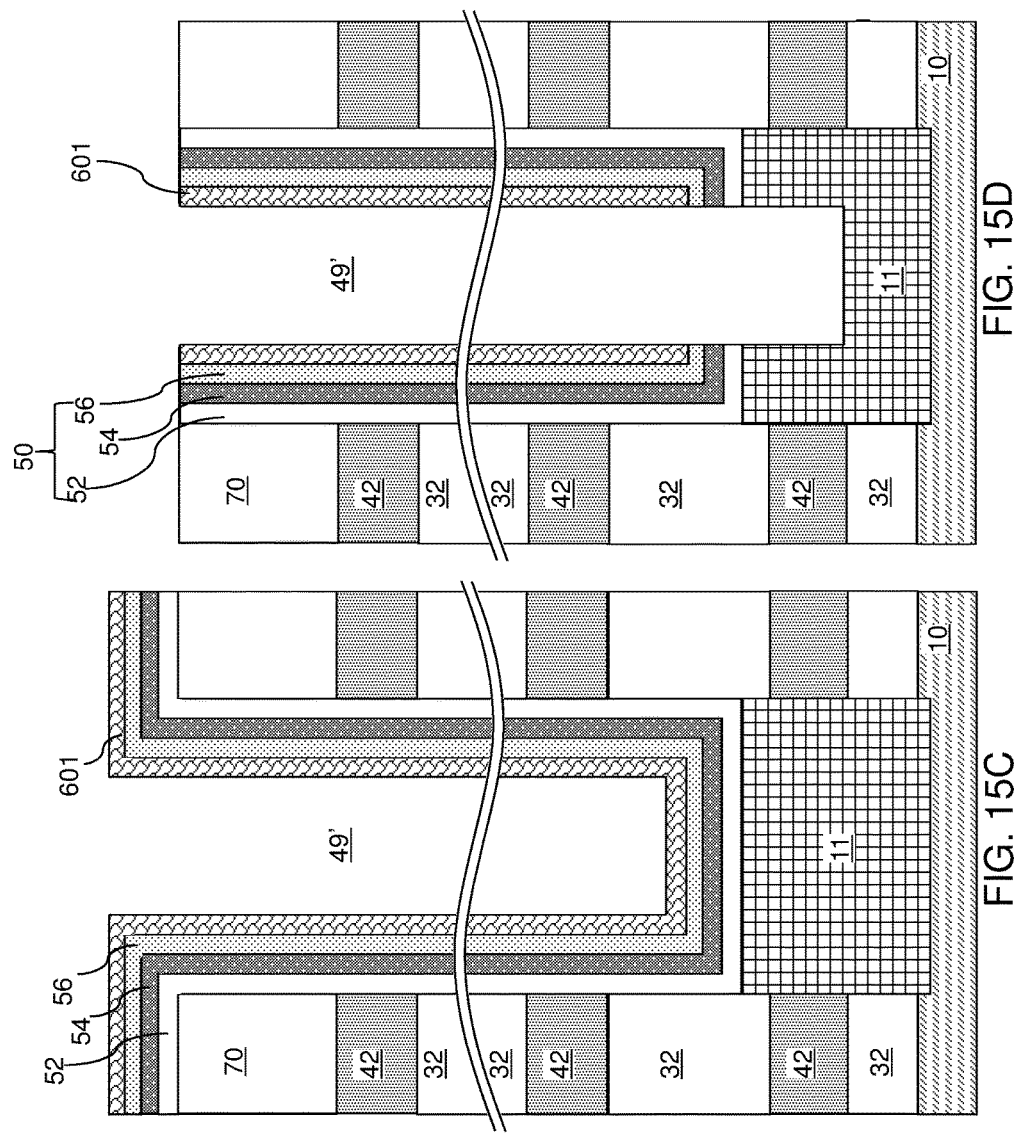

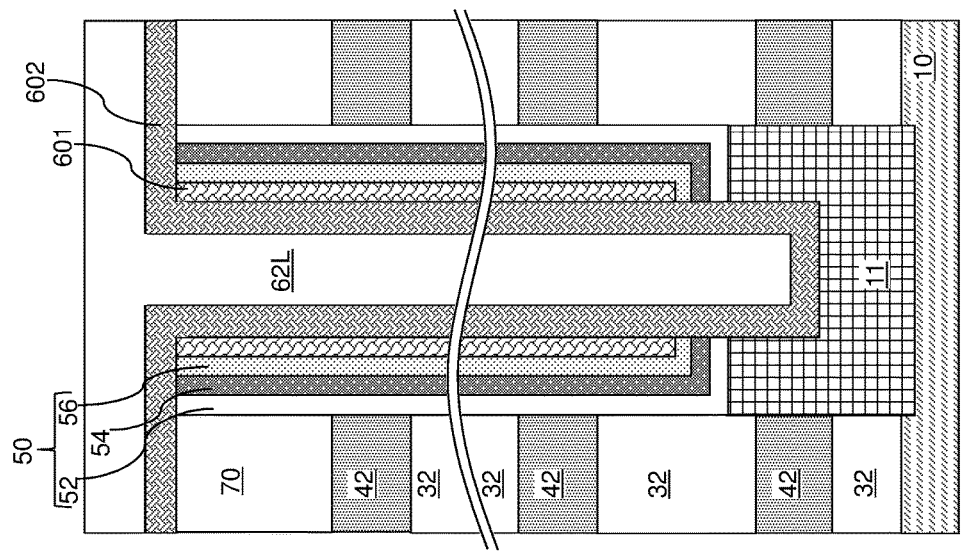
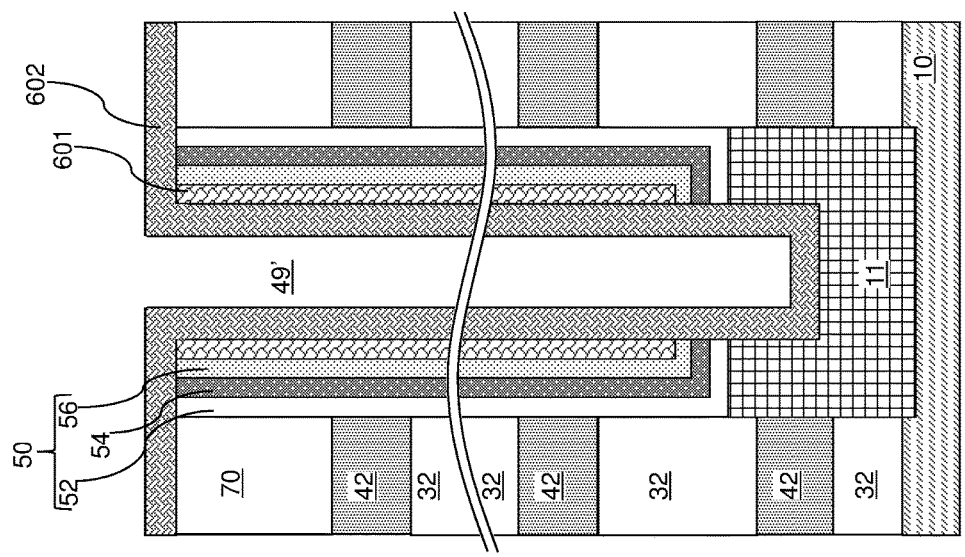

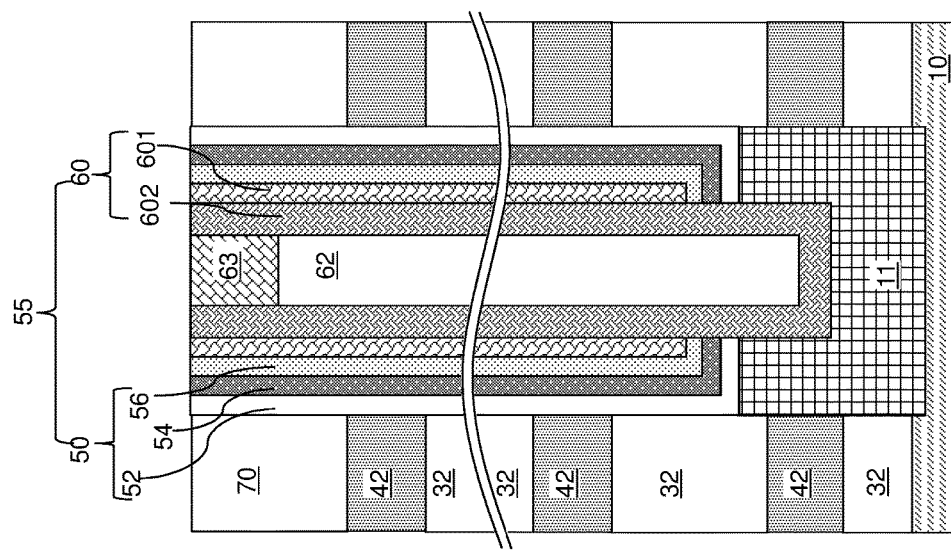
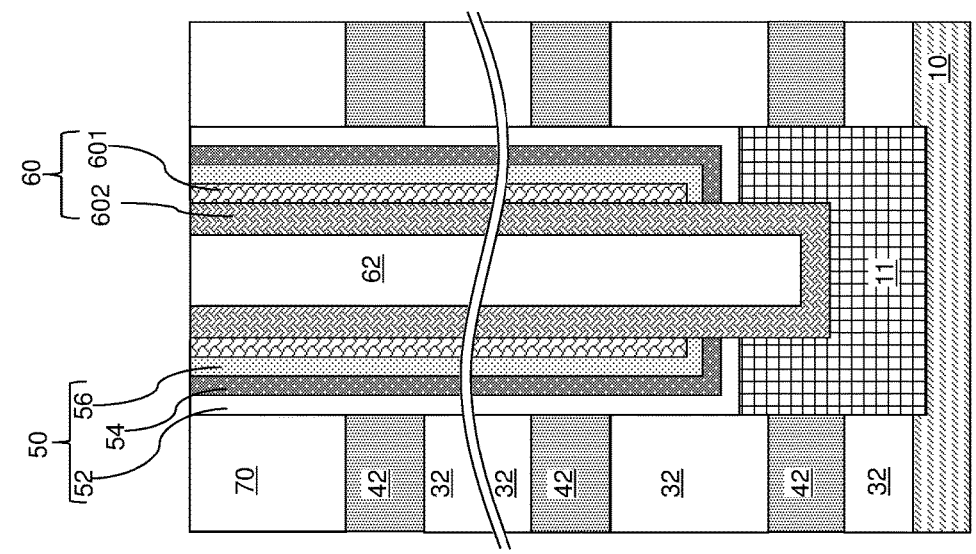

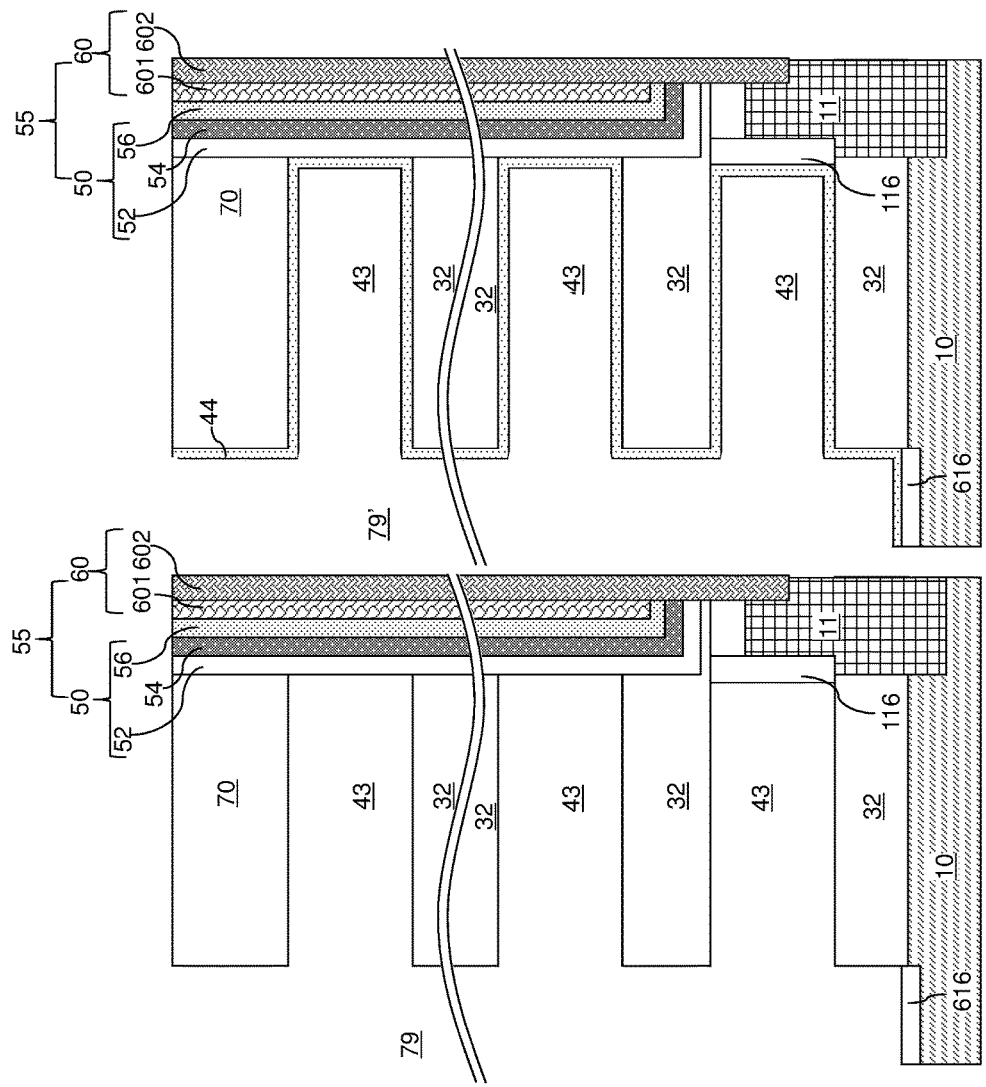

HYDROGEN DIFFUSION BARRIER STRUCTURES FOR CMOS DEVICES AND METHOD OF MAKING THE SAME

FIELD

The present disclosure relates generally to the field of semiconductor devices, and particular to hydrogen diffusion barrier structures for CMOS devices and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure includes a field effect transistor located on a semiconductor substrate, a silicon oxide liner contacting at least a portion of the semiconductor substrate, a silicon nitride liner contacting a top surface and a sidewall of the silicon oxide liner and contacting a top surface of the semiconductor substrate in a seal region, a silicon nitride diffusion barrier layer including a planar bottom surface that contacts top surfaces of vertically extending portions of the silicon nitride liner, and a silicon oxide material portion overlying the silicon nitride diffusion barrier layer. A combination of the silicon nitride liner and the silicon nitride diffusion barrier layer constitutes a hydrogen diffusion barrier structure that continuously extends from the seal region and over the field effect transistor.

According to another aspect of the present disclosure, a semiconductor structure is provided, which comprises: a field effect transistor located on a semiconductor substrate; a silicon oxide liner contacting top surfaces of active regions of the field effect transistor; a silicon nitride liner contacting a top surface and a sidewall of the silicon oxide liner; a gate cap dielectric overlying a gate electrode of the field effect transistor; a silicon nitride diffusion barrier layer including a planar bottom surface that contacts top surfaces of vertically extending portions of the silicon nitride liner and a top surface of the gate cap dielectric; a silicon oxide material portion overlying the silicon nitride diffusion barrier layer; and a gate contact via structure that extends through the silicon nitride diffusion barrier layer and the gate cap dielectric and contacts the gate electrode of the field effect transistor.

According to yet another embodiment of the present disclosure, a method of forming a semiconductor structure is provided, which comprises: forming a field effect transistor on a semiconductor substrate in a substrate, wherein the field effect transistor comprises active regions embedded in the semiconductor substrate and a gate electrode overlying the semiconductor substrate; forming a silicon oxide liner over the field effect transistor and on a top surface of the semiconductor substrate; forming at least one opening laterally enclosing an area through the silicon oxide liner, wherein the top surface of the semiconductor substrate is physically exposed within each of the at least one opening in the silicon oxide liner; forming a silicon nitride liner over the silicon oxide liner and on the top surface of the semiconductor substrate in a seal region defined between an inner periphery and an outer periphery of the at least one opening in the silicon oxide liner; forming a silicon oxide planarization layer including a planar top surface around the gate electrode and over portions of the silicon nitride liner that laterally surround the gate electrode; forming a silicon nitride diffusion barrier layer over the silicon oxide planarization layer and top surfaces of vertically extending portions of the silicon nitride liner; and forming a silicon oxide material portion over the silicon nitride diffusion barrier layer, wherein a combination of the silicon nitride liner and the silicon nitride diffusion barrier layer constitutes a hydrogen diffusion barrier structure that continuously extends from the seal region and over the field effect transistor.

BRIEF DESCRIPTION OF THE DRAWINGS

FIGS. 15A-15H are sequential schematic vertical cross-sectional views of a memory opening within the exemplary structure during formation of a memory stack structure, an optional dielectric core, and a drain region therein according to an embodiment of the present disclosure.

FIGS. 19A-19D are sequential vertical cross-sectional views of a region of the exemplary structure during formation of electrically conductive layers according to an embodiment of the present disclosure.

DETAILED DESCRIPTION

Figure 1:
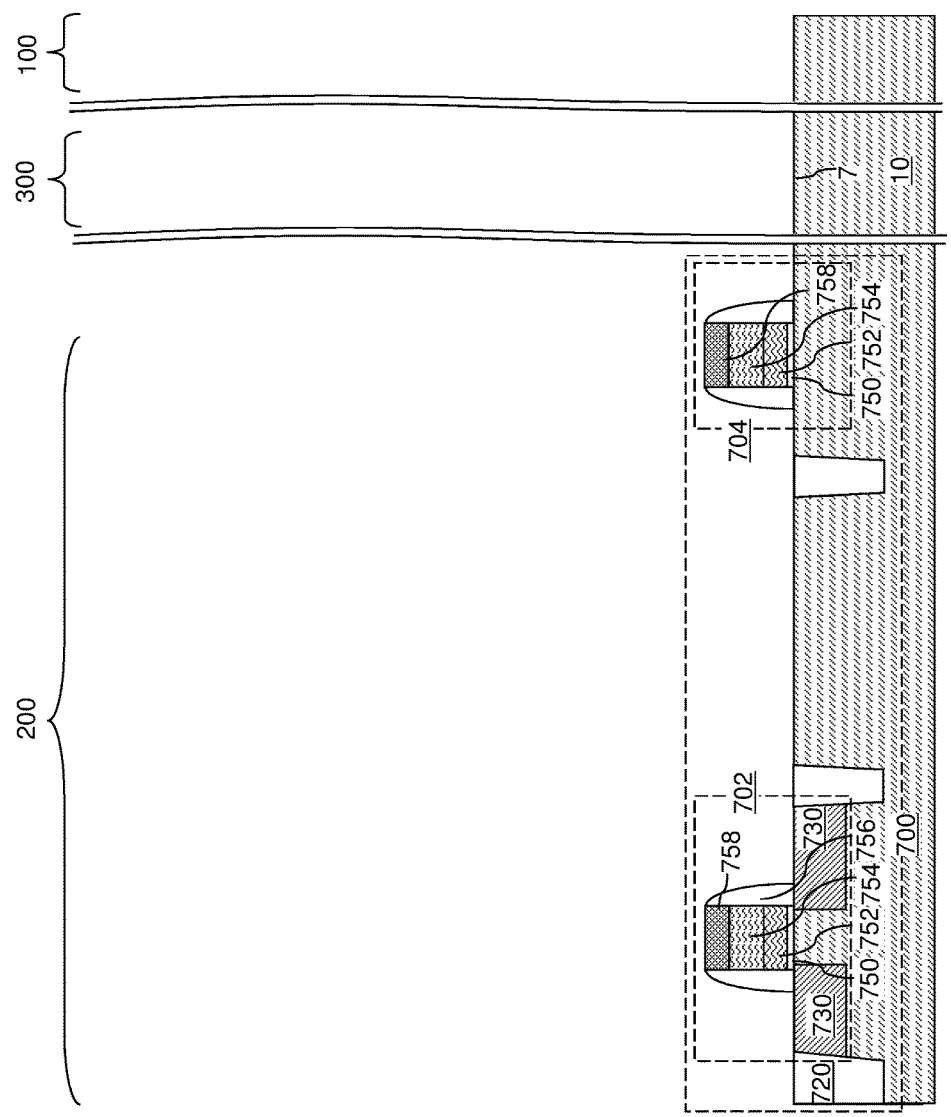
FIG. 1 is a schematic vertical cross-sectional view of an exemplary structure after formation of a field effect structure and an in-process dummy gate structure according to a first embodiment of the present disclosure.

During manufacture of three-dimensional vertical NAND devices, an alternating stack of silicon nitride layers and silicon oxide layers can be formed, and the silicon nitride layers can be subsequently replaced with electrically conductive layers to form word lines. However, the silicon nitride layers release a significant amount of hydrogen atoms prior to replacement with the electrically conductive layers. Active hydrogen atoms can diffuse downward into a peripheral device region on a semiconductor substrate, and degrade device characteristics of CMOS peripheral (e.g., driver circuit) devices thereupon. Formation of dedicated hydrogen diffusion barrier structures generally include significant number of processing steps, and may still leave gaps among hydrogen diffusion barrier structures because silicon oxide layers function as hydrogen diffusion paths to the CMOS devices.

The embodiments of the present disclosure provide a low cost and simply hydrogen diffusion barrier structures for reducing or preventing diffusion of hydrogen atoms into peripheral devices on the semiconductor substrate without incurring device area penalty. Hydrogen diffusion into CMOS devices on a semiconductor substrate can be reduced or suppressed, and device characteristics of the CMOS devices can be enhanced. Hydrogen diffusion may be blocked both laterally and vertically employing a combination of diffusion barrier structures. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing field effect transistors and overlying semiconductor devices such as three-dimensional memory devices on a same semiconductor substrate. The exemplary structure includes a substrate 10, which can be a semiconductor substrate. As used herein, a semiconductor substrate 10 may be a semiconductor wafer, and can include at least one elemental semiconductor material (e.g., single crystal silicon wafer or layer), at least one III-V compound semiconductor material, or at least one II-VI compound semiconductor material. The semiconductor wafer may have one or more doped wells in its top surface and/or one or more semiconductor layers located over its top surface. Alternatively, the semiconductor substrate 10 may comprise a semiconductor layer formed on a top surface of an insulating or conductive substrate, such as a silicon-on-insulator type substrate. As used, herein, the term semiconductor substrate 10 includes a semiconductor wafer with or without another semiconductor layer over its top surface, or a non-semiconductor substrate having at least one semiconductor layer located over its top surface. The semiconductor substrate 10 can have a major surface 7, which can be, for example, a topmost surface. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the semiconductor substrate 10. The peripheral circuitry may comprise sense amplifiers and/or other driver circuitry for the memory device. The at least one semiconductor device can include, for example, field effect transistors 702, such as field effect transistors arranged as CMOS device. For example, at least one shallow trench isolation structure 720 can be formed by etching portions of the semiconductor substrate 10 and depositing a dielectric material therein. A gate dielectric layer, at least one gate conductor layer, and a gate cap dielectric layer can be formed over the semiconductor substrate 10, and can be subsequently patterned to form at least one gate structure (750, 752, 754, 758), each of which can include a gate dielectric 750, a gate electrode (752, 754), and a gate cap dielectric 758. The gate cap dielectric 758 can comprise any suitable insulating material, such as silicon nitride, silicon oxide or silicon oxynitride. In one embodiment, the gate cap dielectric 758 comprises silicon nitride, and is referred to as a gate cap silicon nitride portion 758. Each contiguous set of a gate cap silicon nitride portion 758 and a gate electrode (752, 754) can be formed by depositing and patterning gate electrode layer(s) and a gate cap silicon nitride layer. An anisotropic etch process that employs a same mask pattern can be employed to pattern the gate electrode layer(s) and the gate cap silicon nitride layer to provide the gate cap silicon nitride portions 758 and the gate electrodes (752, 754).

The gate electrode (752, 754) may include a stack of a first gate electrode portion 752 and a second gate electrode portion 754. For example, the first gate electrode portion 752 can include a doped semiconductor material such as doped polysilicon, and the second gate electrode portion 754 includes a metallic material such a metal (e.g., tungsten), metal nitride or metal silicide material. At least one gate spacer 756 including a dielectric material (such as silicon oxide) can be formed around the at least one gate structure (750, 752, 754, 758) by depositing and anisotropically etching a dielectric liner. Active regions 730 can be formed in upper portions of the semiconductor substrate 10, for example, by introducing electrical dopants employing the at least one gate structure (750, 752, 754, 758) as masking structures. Additional masks may be employed as needed. The active region 730 can include source regions and drain regions of field effect transistors.

At least one in-process dummy gate structure 704 including a gate dielectric 750, a gate electrode (752, 754), a gate cap silicon nitride portion 758, and at least one gate spacer 756 can be formed in addition to the field effect transistors. The at least one in-process dummy gate structure 704 may, or may not, include respective active regions 730. The region (i.e., area) of the at least one semiconductor device 700 is herein referred to as a peripheral device region 200. The region in which a memory array is subsequently formed is herein referred to as a memory array region 100. The memory array region 100 can be a memory plane, for example. A contact region 300 for subsequently forming stepped terraces of electrically conductive layers (e.g., word lines) can be provided adjacent to the memory array region 100. The field effect transistors 702, the at least one in-process dummy structure 704, and additional semiconductor devices (not shown) are provided in the peripheral device region 200.

Figure 2:
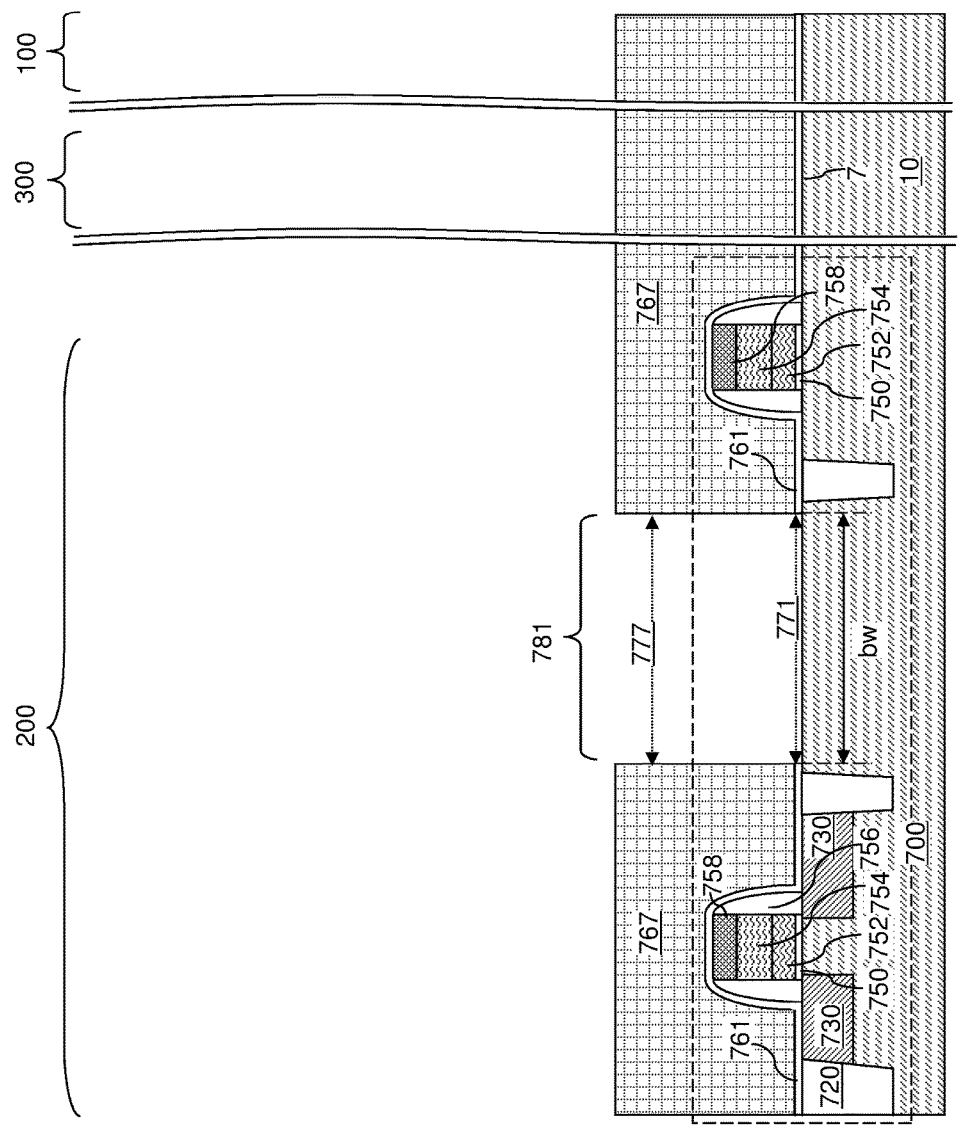
FIG. 2 is a schematic vertical cross-sectional view of the exemplary structure after formation and patterning of a silicon oxide liner according to an embodiment of the present disclosure.

Referring to FIGS. 2 and 3A-3E, a silicon oxide liner 761 is formed by a conformal deposition process on the top surface of the semiconductor substrate 10, outer sidewalls of the gate spacers 756, and the top surfaces of the gate cap silicon nitride portion 758. FIG. 2 is a vertical cross-sectional view of the exemplary structure, and FIGS. 3A-3E are top-down views of various configurations of the exemplary structure. Alternatively, the silicon oxide liner 761 can be formed prior to forming the gate spacers 756. In this configuration, the silicon oxide liner 761 extends on the sides of the gate structure (752, 754, 758) under the gate spacers 756 and on the top of the cap silicon nitride portion 758. The silicon oxide liner 761 can be formed, for example, by thermal decomposition of tetraethylorthosilicate (TEOS) in a low pressure chemical vapor deposition process. The thickness of the silicon oxide liner 761 can be in a range from 1.5 nm to 15 nm, such as from 2 nm to 10 nm, although lesser and greater thicknesses can also be employed. An interface between the semiconductor material of the semiconductor substrate 10 and a silicon oxide material is more desirable than an interface between the semiconductor material and a silicon nitride material because an interface with silicon oxide generates less interfacial states than an interface with silicon nitride. Thus, direct contact between the silicon oxide liner 761 and the active regions 730 of the field effect transistors 702 has the beneficial effect of enhancing performance of the field effect transistors relative to comparative structures in which a silicon nitride material contacts the active regions 730.

A photoresist layer 767 can be applied over the silicon oxide liner 761, and can be lithographically patterned to form annular openings 777 therein. As used herein, an "annular opening" refers to an opening having a horizontal cross-sectional shape that is topologically homeomorphic to an annulus. Thus, each annular opening has an inner periphery that has a first closed shape and is laterally spaced from, and is entirely enclosed within, an outer periphery having a second closed shape.

Figure 3B:
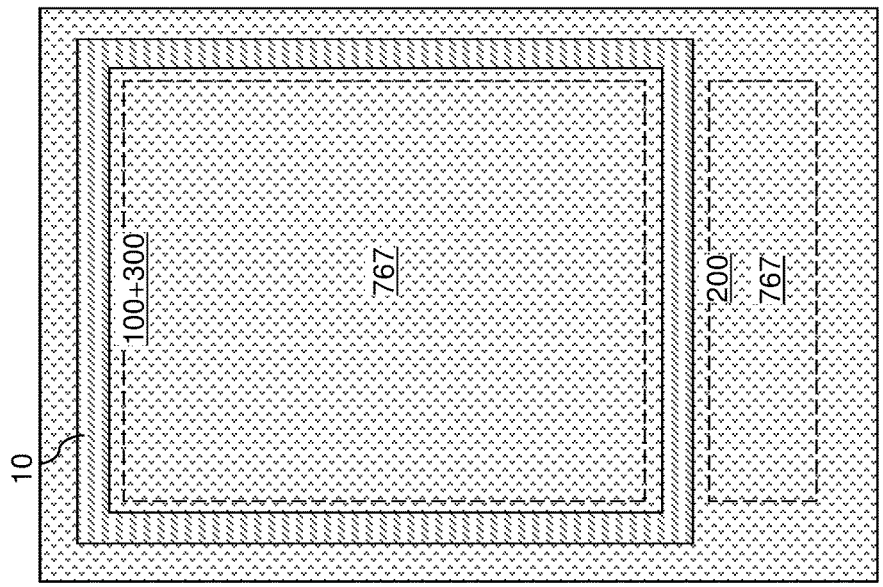
FIGS. 3A-3E are top-down views of exemplary patterns that can be employed to pattern the silicon oxide liner at the processing steps of FIG. 2.
Figure 3A:
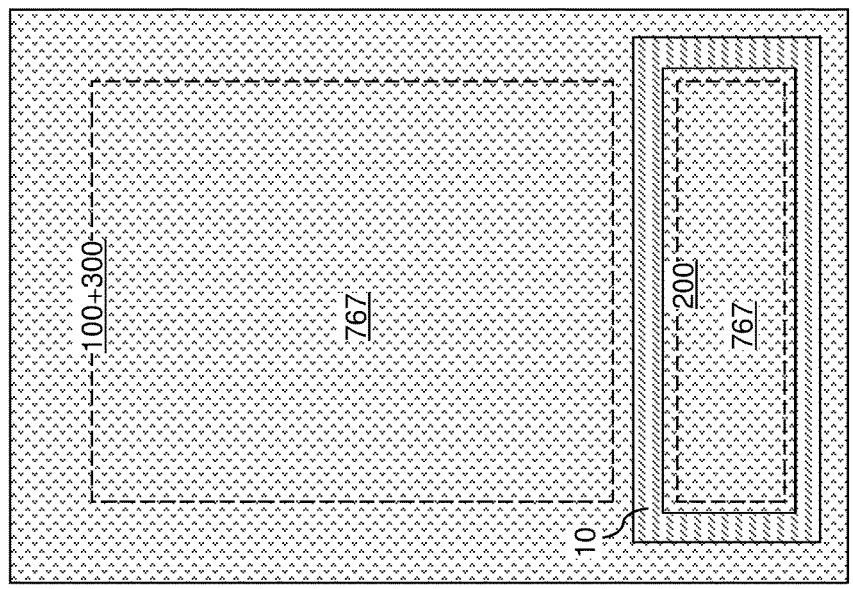
Figure 3D:
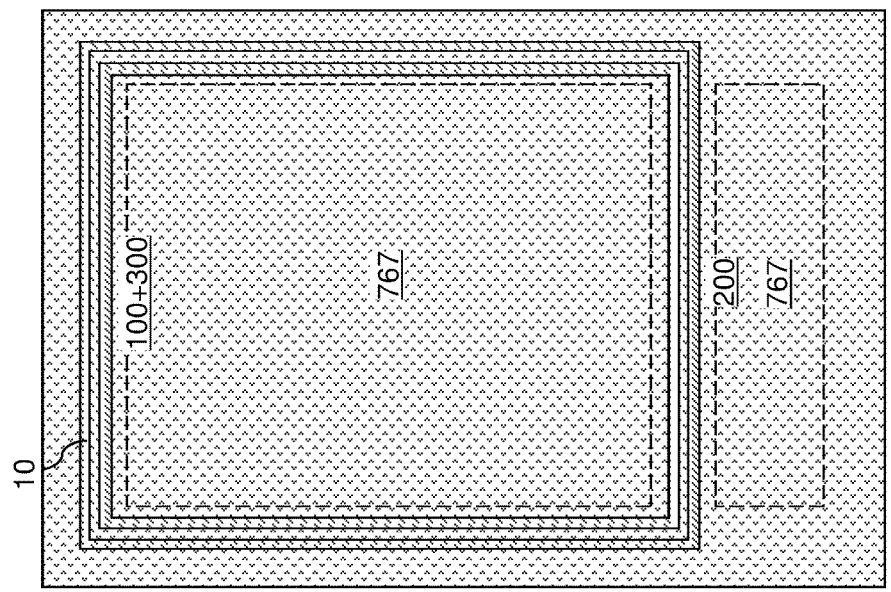
Figure 3C:
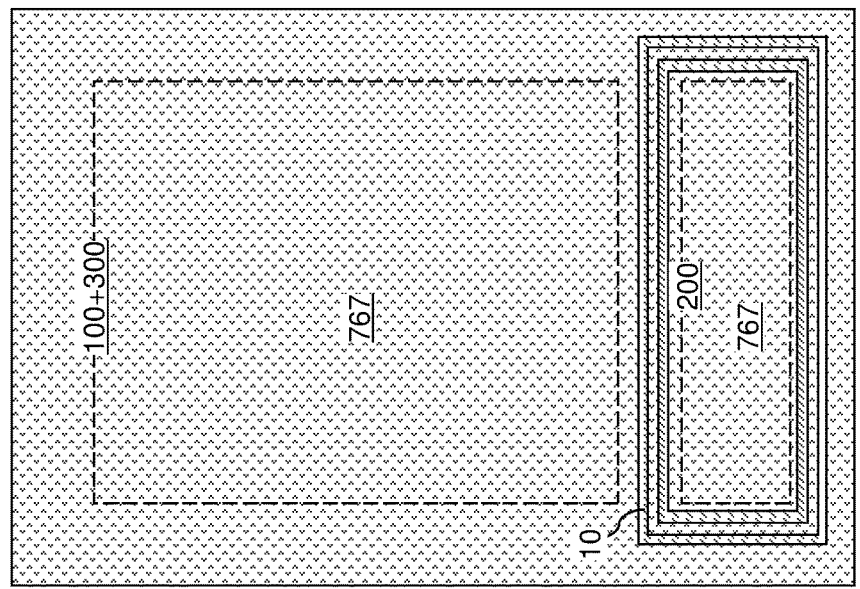
Figure 3E:
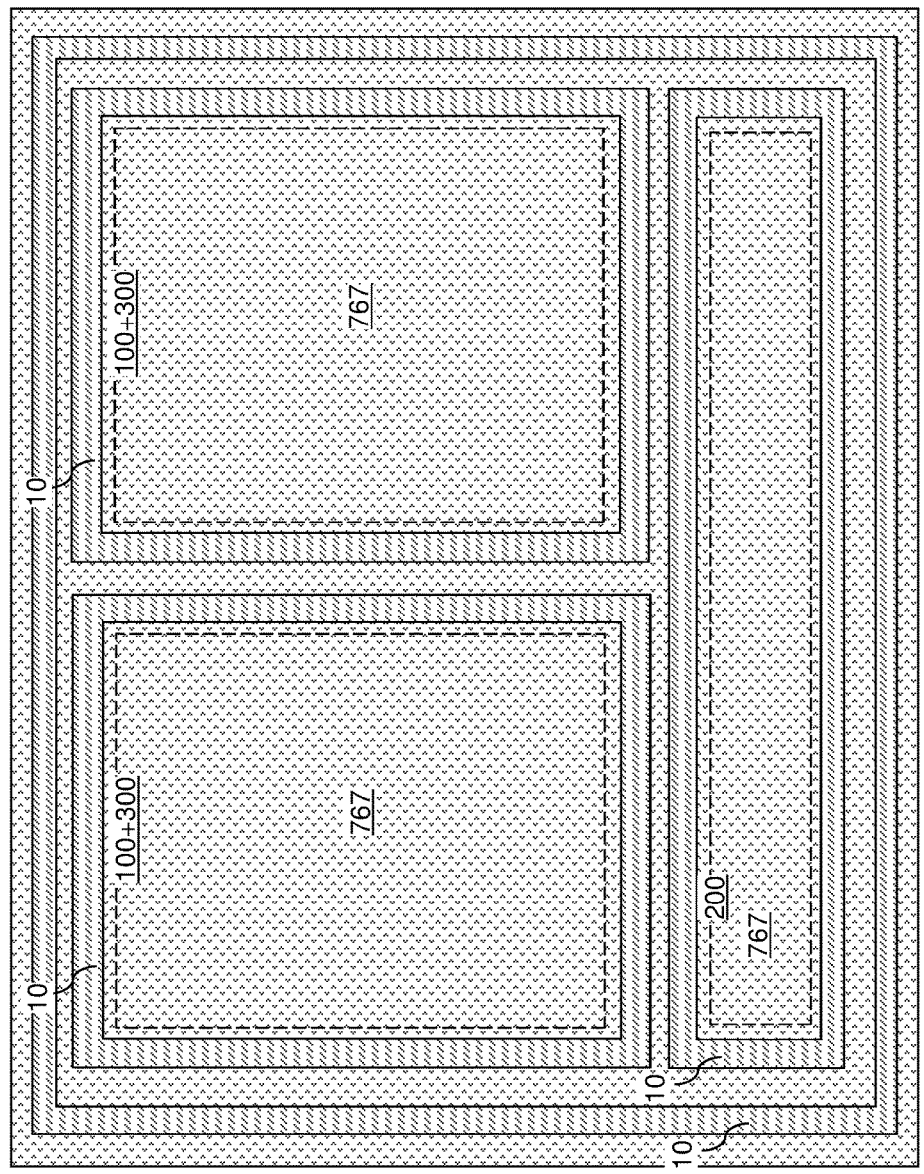

An annular opening 777 in the photoresist layer 767 can laterally enclose the peripheral device region 200 as illustrated in FIG. 3A, and/or can laterally enclose the combination of a memory array region 100 and a contact region 300 as illustrated in FIG. 3B. In some embodiments, a plurality of nested annular openings can be formed in the photoresist layer 767 as illustrated in FIGS. 3C and 3D, and can laterally enclose the peripheral device region 200, and/or the combination of the memory array region 100 and the contact region 300. Further, if multiple memory array regions 100 (e.g., multiple memory planes) and associated contact regions 300 are formed on a same semiconductor chip, and/or if a plurality of peripheral device regions 200 is formed on the same semiconductor chip, multiple annular openings may laterally enclose a specific region and/or multiple regions as illustrated in FIG. 3E. In one embodiment, at least one annular opening in the photoresist layer 767 is formed such that each continuous path between a peripheral device region 200 and any of the memory array regions 100 is intersected by an area of the at least one annular opening in the photoresist layer 767. In other words, an area of the at least one annular opening in the photoresist layer 767 is interposed in every path connecting any peripheral device region 200 and any memory array region 100 in a same semiconductor chip.

An etch process is performed to remove physically exposed portions of the silicon oxide liner 761 underneath the opening(s) in the photoresist layer 767. For example, an anisotropic reactive ion etch can be employed to remove the portions of the silicon oxide liner 761 that are not covered by the photoresist layer 767 to form openings 771 in the silicon oxide liner 761. The photoresist layer 767 can be subsequently removed, for example, by ashing. The width of each of the openings (771, 777) can be the same and equal to a width "bw" shown in FIG. 2.

Figure 4:
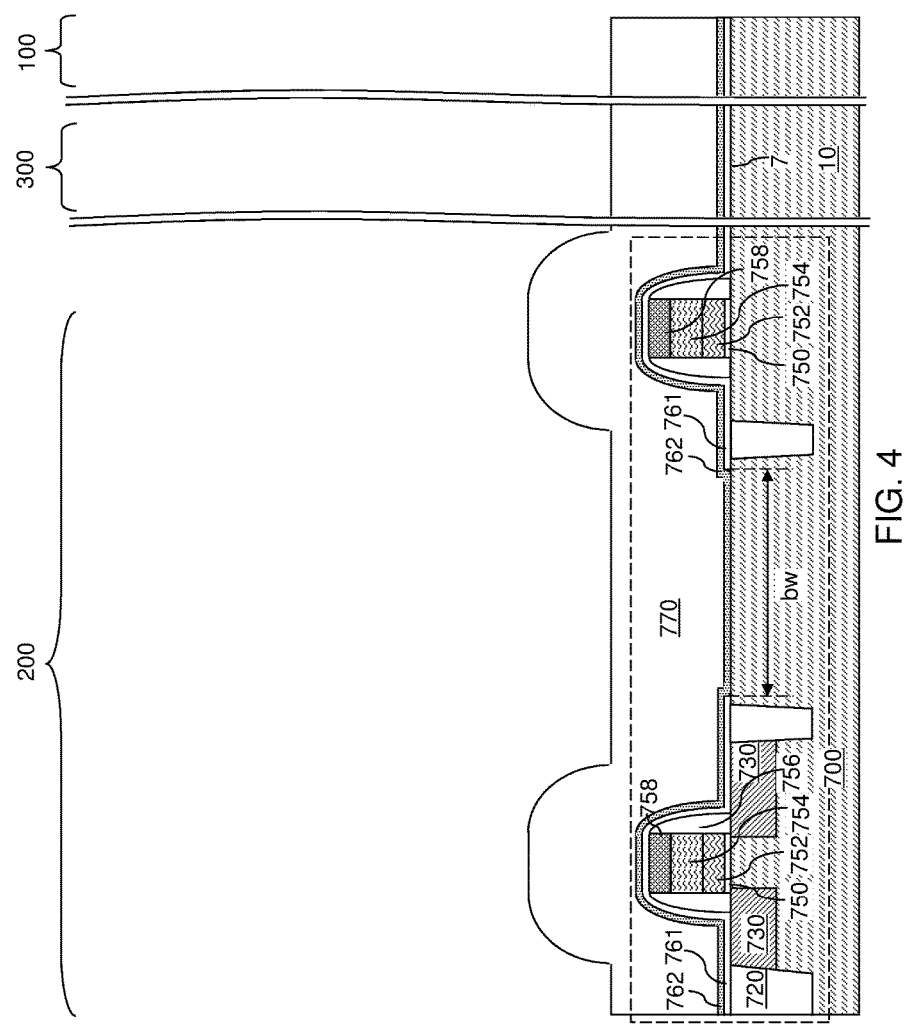
FIG. 4 is a schematic vertical cross-sectional view of the exemplary structure after formation of a silicon nitride liner and a planarization silicon oxide layer according to an embodiment of the present disclosure.

Referring to FIG. 4, a silicon nitride liner 762 is formed on the top surface of the silicon oxide liner 761 and on the physically exposed top surface of the semiconductor substrate 10. The silicon nitride liner 762 can be deposited as a continuous material layer without any opening therein by a conformal deposition process such as low pressure chemical vapor deposition (LPCVD). The thickness of the silicon nitride liner 762 can be in a range from 5 nm to 100 nm, such as from 30 nm to 50 nm, although lesser and greater thicknesses can also be employed. The silicon nitride liner 762 contacts a top surface of the semiconductor substrate 10 in each seal region that is defined as the entire area between an inner periphery and an outer periphery of a respective opening 771 in the silicon oxide liner 761.

In one embodiment, the inner periphery and the outer periphery of each seal region 781 located over the opening 771 can be proximate to a respective shallow trench isolation structure 720. In this case, each seal region can be located between a pair of annular shallow trench isolation structures 720. As used herein, an "annular" three-dimensional structure refers to a three-dimensional structure having a three-dimensional shape that is topologically homeomorphic to a torus. The distance between the inner periphery and the outer periphery of a seal region 781 (i.e., between two disjoined portions of the silicon oxide liner 761) is herein referred to as a barrier width bw, which may be uniform throughout the seal region or may have a variable width. In one embodiment, the barrier width bw can be in a range from 30 nm to 300 nm, although lesser and greater barrier widths bw can also be employed.

Each opening 771 in the silicon oxide liner 761 laterally encloses an area, which can be a peripheral device region 200 or a memory array region 100. A top surface of the semiconductor substrate 10 contacts the silicon nitride liner 762 through each opening 771 in the silicon oxide liner 761. In one embodiment, each seal region 781 can have a width of at least 30 nanometers, and can laterally surround a device region including field effect transistors.

A planarization silicon oxide layer 770 can be deposited over the silicon nitride liner 762. The planarization silicon oxide layer 770 is an in-process structure that is subsequently modified. The planarization silicon oxide layer 770 includes a silicon oxide material such as undoped silicate glass, phosphosilicate glass, or borophosphosilicate glass. The planarization silicon oxide layer 770 can be deposited by sub-atmospheric chemical vapor deposition (SACVD) or low pressure chemical vapor deposition (LPCVD). The duration of the deposition process for depositing the planarization silicon oxide layer 770 is selected such that a bottommost portion of the top surface of the planarization silicon oxide layer 770 is formed above a horizontal plane including a topmost surface of the silicon nitride liner 762.

Figure 5:
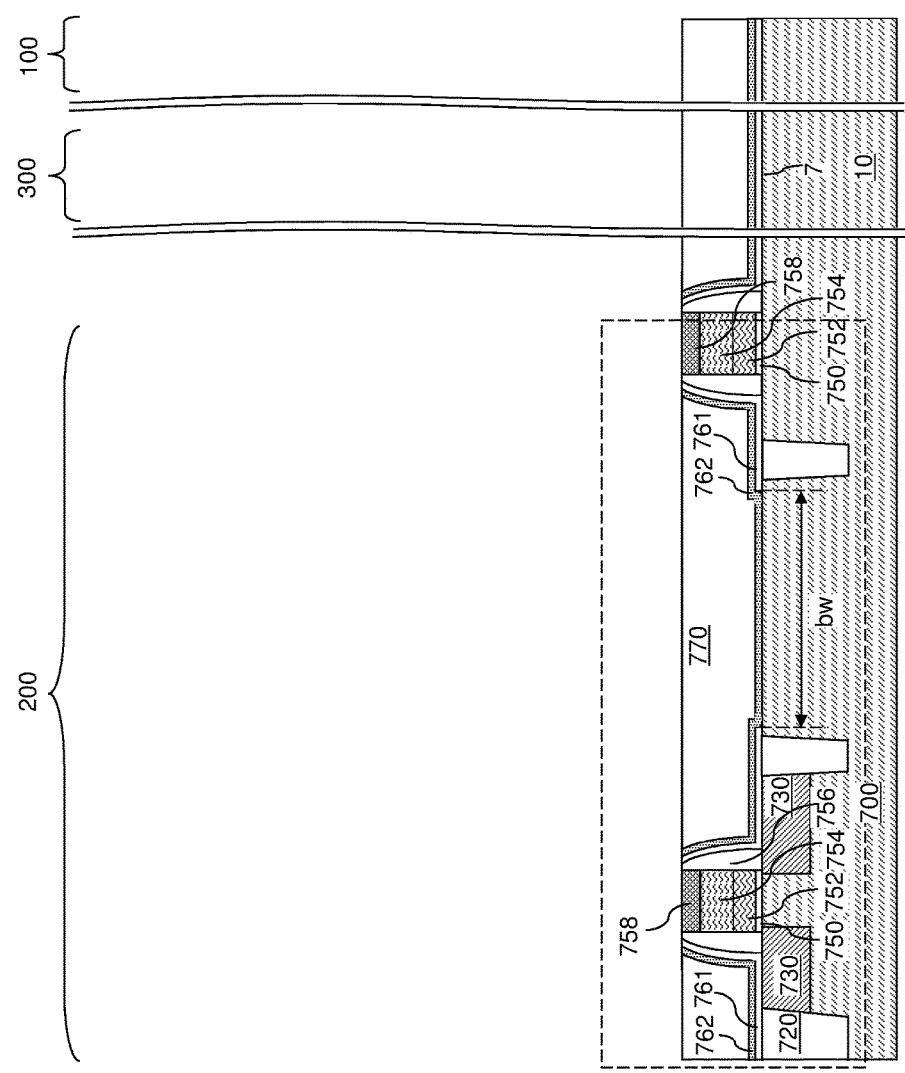
FIG. 5 is a schematic vertical cross-sectional view of the exemplary structure after planarization of the planarization silicon oxide layer, the silicon nitride liner, and the silicon oxide liner according to an embodiment of the present disclosure.

Referring to FIG. 5, a chemical mechanical planarization (CMP) process is performed to remove portions of the in-process planarization dielectric layer 770 that overlie a horizontal plane including top surfaces of the gate cap silicon nitride portion 758. Portions of the silicon oxide liner 761 that overlie the horizontal plane including the top surfaces of the gate cap silicon nitride portion 758 are removed during the planarization process in addition to removal of portions of the silicon nitride liner 762 and the in-process planarization dielectric layer 770 that overlie the horizontal plane including the top surfaces of the gate cap silicon nitride portion 758. Complete removal of the silicon oxide liner 761 and physical exposure of the top surfaces of the gate cap silicon nitride portions 758 assists in subsequent formation of a continuous hydrogen diffusion barrier structure because the removal of the silicon oxide liner 761 from the top of the cap silicon nitride portions 758 eliminates a hydrogen diffusion path into the transistors 702.

In one embodiment, the gate cap silicon nitride portions 758 can be polished further after the top surfaces of the gate cap silicon nitride portions 758 are physically exposed, provided that the top surfaces of the gate electrodes (752, 754) are not physically exposed. The thickness of remaining portions of the gate cap silicon nitride portions 758 can be in a range from 20 nm to 60 nm, although the gate cap silicon nitride portions 758 may have a lesser or greater thickness after the planarization process. The top surfaces of the gate cap silicon nitride portions 758 can be coplanar with the top surface of the planarization silicon oxide layer 770 after the planarization process. Physically exposed top surfaces of the silicon nitride liner 762 and physically exposed top surfaces of the silicon oxide liner 761 can be within the same horizontal plane as the top surface of the planarization silicon oxide layer 770 and the top surfaces of the gate cap silicon nitride portions 758. The silicon oxide planarization layer 770 includes a planar top surface, and is located around each gate electrode (752, 754) and overlies portions of the silicon nitride liner 762 that laterally surround the gate electrodes (752, 754).

Figure 6:
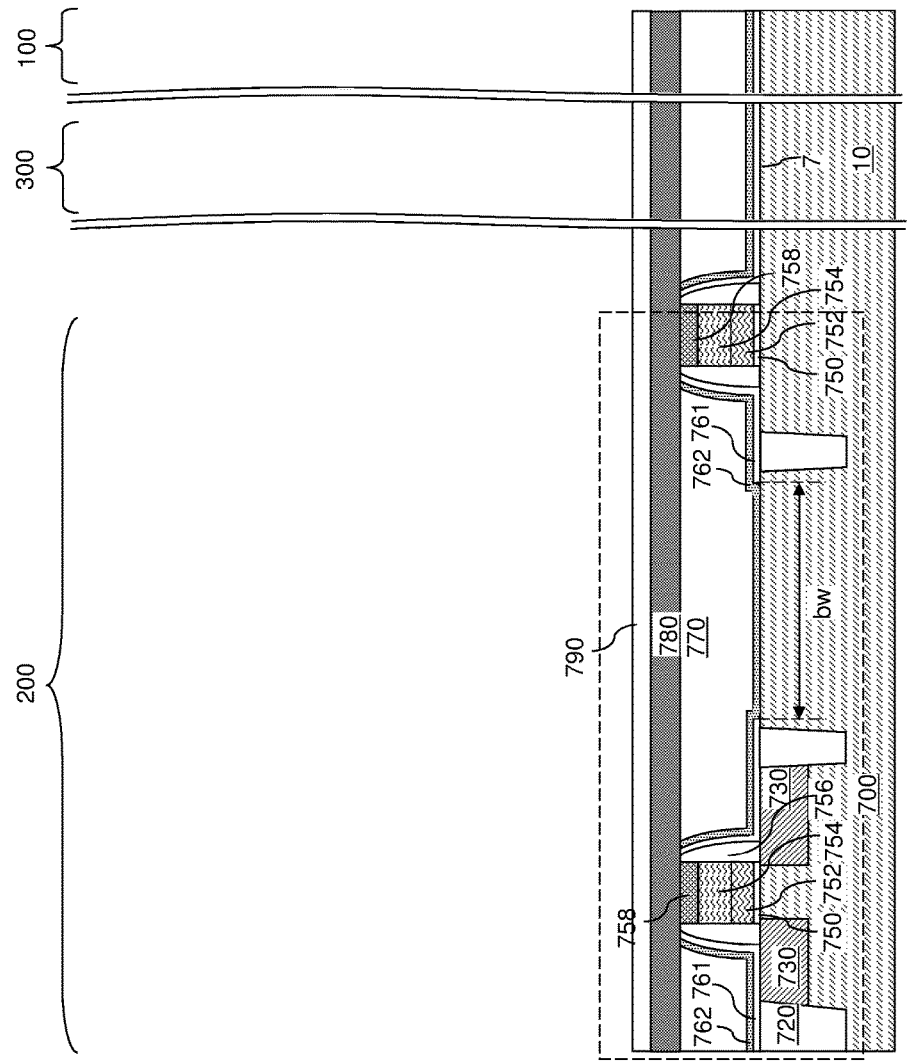
FIG. 6 is a schematic vertical cross-sectional view of the exemplary structure after formation of a silicon nitride diffusion barrier layer and an optional etch stop layer according to an embodiment of the present disclosure.

Referring to FIG. 6, a silicon nitride diffusion barrier layer 780 can be formed on the top surfaces of the planarization silicon oxide layer 770, the silicon oxide liner 761, the silicon nitride liner 762, and the gate cap silicon nitride portions 758. The silicon nitride diffusion barrier layer 780 can be deposited, for example, by low pressure chemical vapor deposition (LPCVD) process. The thickness of the silicon nitride diffusion barrier layer 780 can be in a range from 30 nm to 100 nm, such as from 40 nm to 60 nm, although lesser and greater thicknesses can also be employed. The silicon nitride diffusion barrier layer 780 is formed on top surfaces of vertically extending portions of the silicon nitride liner 762. In one embodiment, the silicon nitride diffusion barrier layer 780 contacts an entire top surface of each gate cap silicon nitride portion 758.

An optional etch stop layer 790 can be formed over the silicon nitride diffusion barrier layer 780. In one embodiment, the optional etch stop layer 790 can include silicon oxide or a dielectric metal oxide. The thickness of the optional etch stop layer 790 can be in a range from 5 nm to 100 nm, although lesser and greater thicknesses can also be employed.

Figure 7:
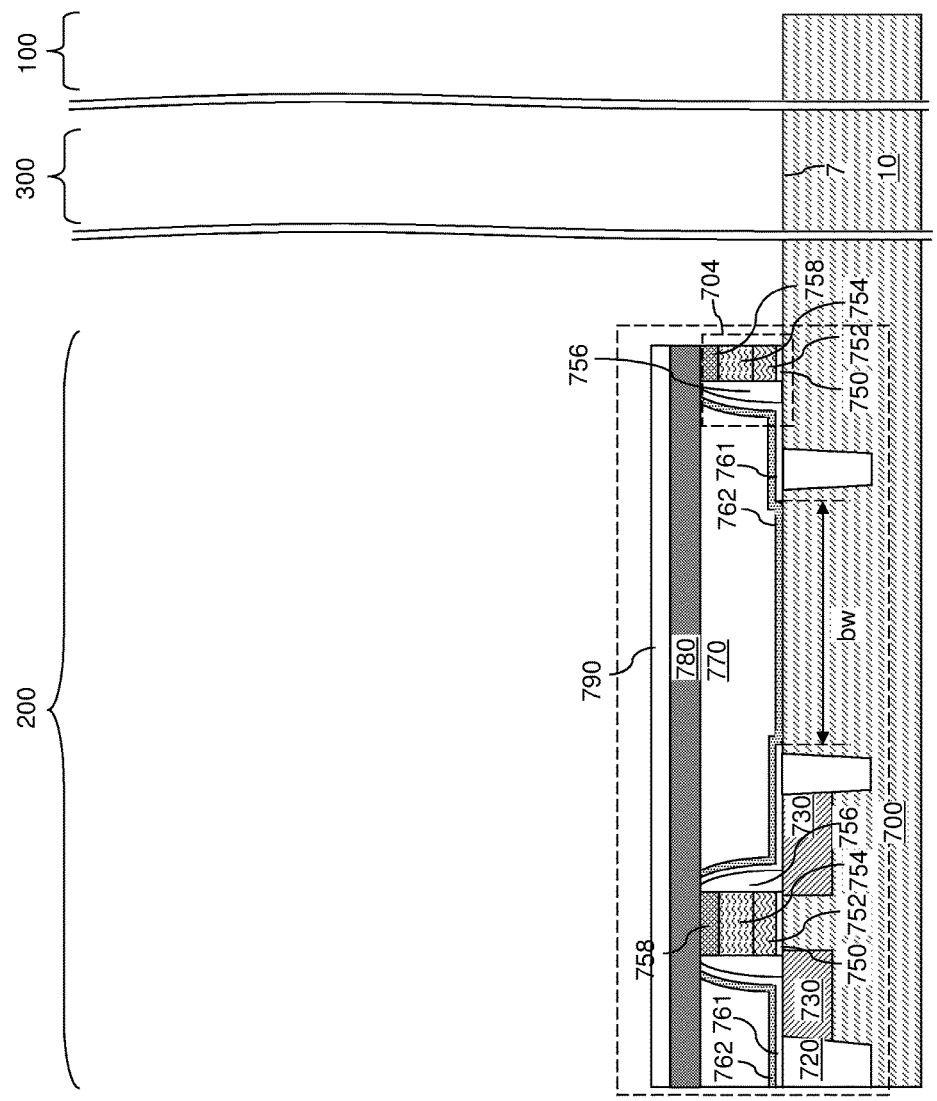
FIG. 7 is a schematic vertical cross-sectional view of the exemplary structure after patterning the optional etch stop layer, the silicon nitride diffusion barrier layer, and the in-process dummy gate structure according to an embodiment of the present disclosure.

Referring to FIG. 7, a photoresist layer (not shown) can be applied over the optional etch stop layer 790, and can be lithographically patterned to cover the peripheral device region 200 without covering the memory array region 100 or the contact region 300. Various material portions overlying the top surface of the semiconductor substrate 10 and not covered by the photoresist layer can be removed by an etch process that employs the photoresist layer as an etch mask layer. In one embodiment, an anisotropic etch such as a reactive ion etch can sequentially etch the materials of the etch stop layer 790, the silicon nitride diffusion barrier layer 780, the planarization silicon oxide layer 770, the silicon nitride liner 762, the silicon oxide liner 761, the gate cap silicon oxide portions 758, the gate electrodes (752, 764), the gate dielectrics 750, and the gate spacers 756. The top surface of the semiconductor substrate 10 can be physically exposed in the memory array region 100 and the contact region 300. Preferably, the etch cuts through the dummy gate stack structure 704. The photoresist layer can be subsequently removed, for example, by ashing.

In one embodiment, the peripheral device region 200 can include a dummy gate stack structure 704 that continuously extends around a periphery of the peripheral device region 200 to laterally enclose a device region including the field effect transistors. The dummy gate stack structure 704 includes a same set of components (such as a gate dielectric 750, a gate electrode (752, 754), a gate cap silicon nitride portion 758) as a gate stack structure (750, 752, 754, 758) of the field effect transistor 702, but is not employed as functional components of a field effect transistor 702. In this case, edges of the photoresist layer can be formed between an inner periphery of the dummy gate stack structure 704 and an outer periphery of the dummy gate stack structure (75, 752, 754, 758) by lithographic patterning of the photoresist layer. During the anisotropic etch process that removes material portions overlying the semiconductor substrate 10 within areas that are not covered by the photoresist layer, outer portions of the dummy gate stack structure 704 can be removed to provide outer sidewalls that are vertically coincident with sidewalls of the patterned silicon nitride diffusion barrier layer 780. As used herein, a first surface is vertically coincident with a second surface if the second surface overlies, or underlies, the first surface, and if there exists a vertical plane that includes the first surface and the second surface. The remaining portion of the dummy gate stack structure 704 constitutes an annular gate level barrier structure that defines the outer periphery of the peripheral device region 200.

The silicon nitride liner 762 contacts the semiconductor substrate 10 in the seal region 781 and functions as a diffusion barrier structure that prevents diffusion of hydrogen atoms therethrough. The dummy gate stack structure 704 forms an annular gate level barrier structure and laterally encloses a device region, i.e., the peripheral device region 200, on the semiconductor substrate 10. The seal region(s) 781 located at the at least one opening 771 in the silicon oxide liner 761 and the dummy gate stack structure 704 constitute a nested structure. A vertically extending portion of the silicon nitride liner 762 extends along an outer sidewall of a gate spacer 756 located on one side of the dummy gate stack structure 704 and contacts the silicon nitride diffusion barrier layer 780. Each seal region has a width of at least 30 nanometers and laterally surrounds the peripheral device region 200 including the field effect transistors 702. The semiconductor substrate 10 and the combination of the silicon nitride liner 762 and the silicon nitride diffusion barrier layer 780 collectively encapsulate the field effect transistors 702.

Figure 8:
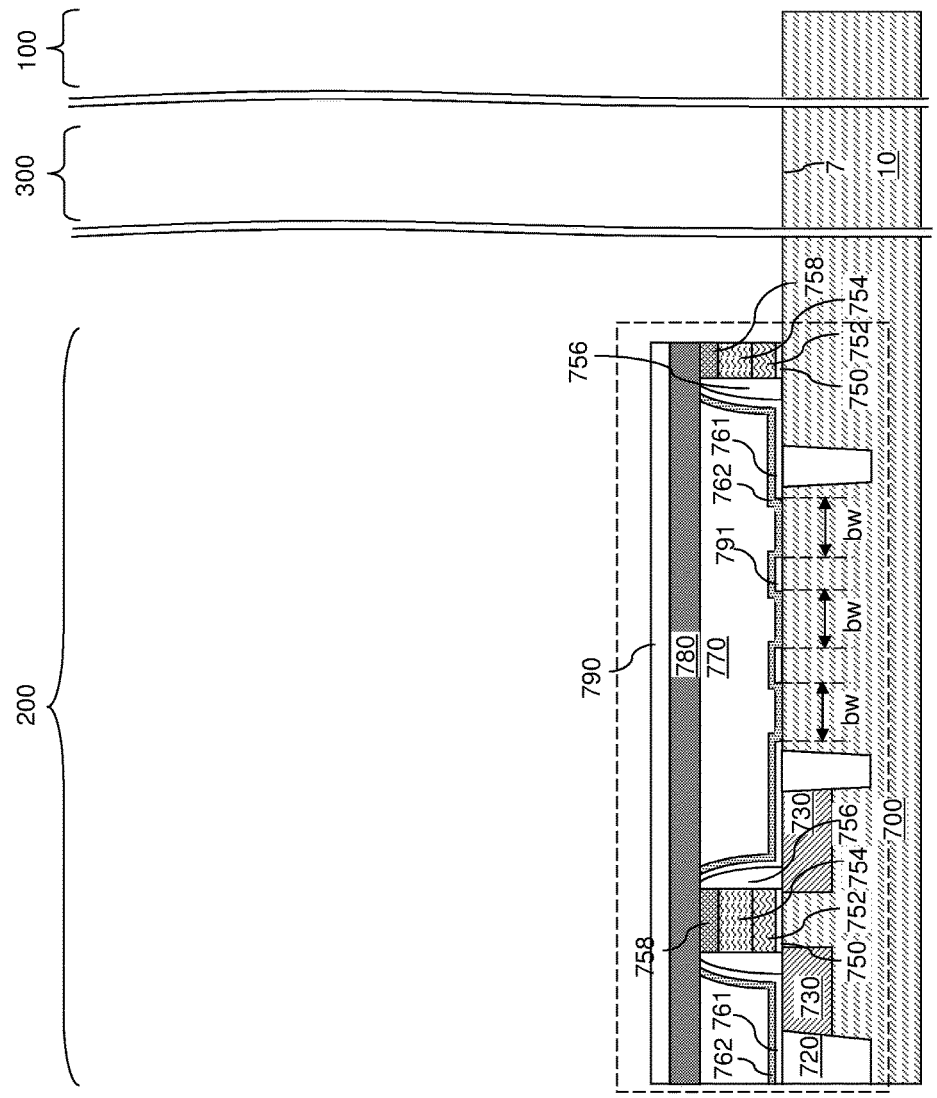
FIG. 8 is a schematic vertical cross-sectional view of a first alternative configuration of the exemplary structure according to an embodiment of the present disclosure at the processing steps of FIG. 7.

Referring to FIG. 8, a first alternative configuration of the exemplary structure can be derived from the exemplary structure of FIG. 7 by forming a plurality of nested openings in the silicon oxide liner 761 in lieu of a single annular opening 771 in the silicon oxide liner 761 prior to formation of a silicon nitride liner 762. The plurality of nested openings can be spaced among one another by at least one silicon oxide strip 791, each of which is a patterned portion of the silicon oxide liner 761. The silicon nitride liner 762 overlies the at least one silicon oxide strip 791 and contacts the semiconductor substrate 10 on both sides of each of the at least one silicon oxide strip. The plurality of nested openings in the silicon oxide liner 761 and the dummy gate stack structure 704 form a nested structure. A vertically extending portion of the silicon nitride liner 762 extends along an outer sidewall of a gate spacer 756 located on one side of the dummy gate stack structure 704, and contacts the silicon nitride diffusion barrier layer 780. The plurality of seal regions in which the silicon nitride liner 762 contacts the semiconductor substrate 10 function as diffusion barrier structures that prevent or reduce diffusion of hydrogen atoms therethrough.

Figure 9:
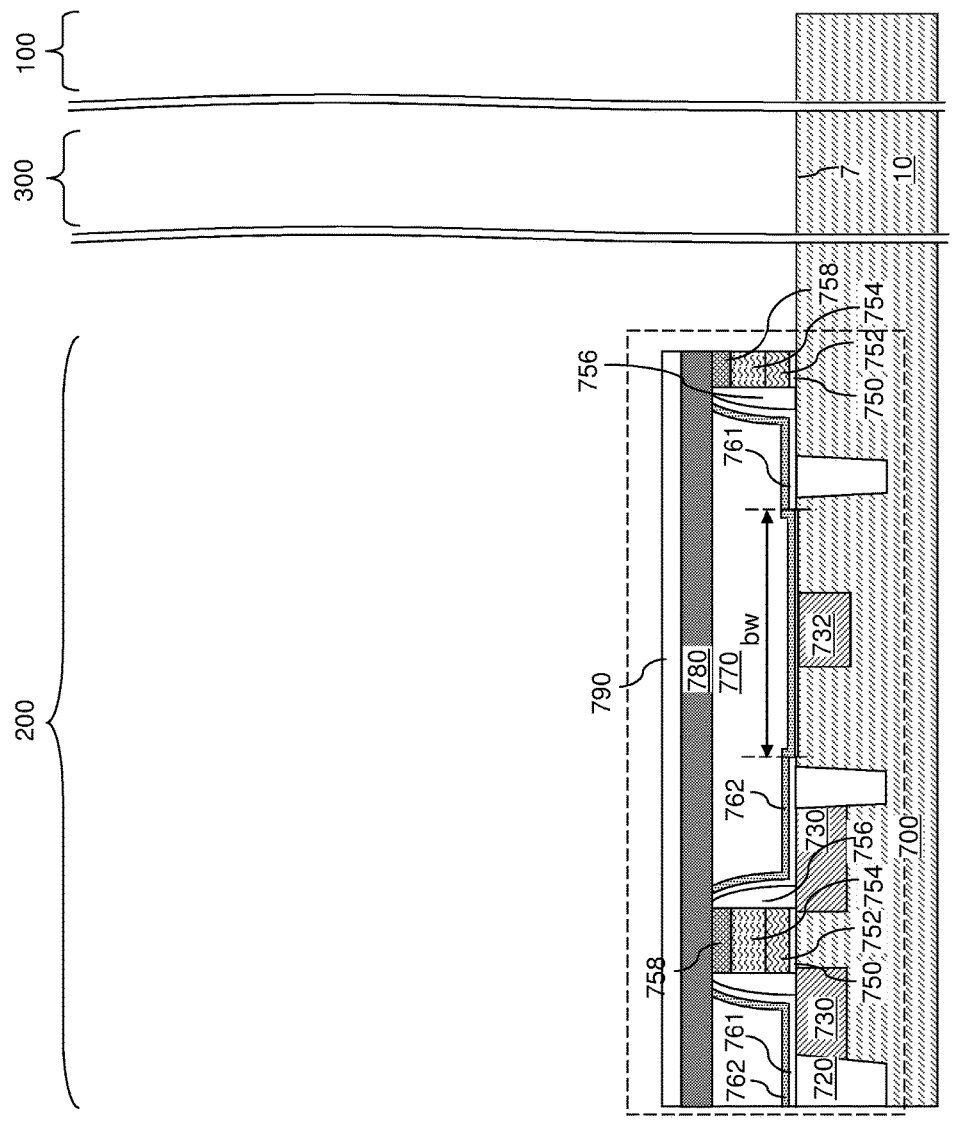
FIG. 9 is a schematic vertical cross-sectional view of a second alternative configuration of the exemplary structure according to an embodiment of the present disclosure at the processing steps of FIG. 7.

Referring to FIG. 9, a second alternative configuration of the exemplary structure can be derived from the exemplary structure of FIG. 7 or from the first configuration of FIG. 8 by forming an electrically doped semiconductor region such as a n-doped semiconductor region 732 within the semiconductor substrate 10 by implanting n-type electrical dopants. The n-doped semiconductor region 732 is formed between an inner periphery and an outer periphery of an annular area (e.g., seal region 781) at which the semiconductor substrate 10 contacts the silicon nitride liner 762. The n-doped semiconductor region 732 is laterally spaced from the silicon oxide liner 761, and contacts a bottom surface of the silicon nitride liner 762. The n-doped semiconductor region 732 is doped with at least one n-type electrical dopant such as phosphorus and arsenic.

While a single n-doped semiconductor region 732 is illustrated herein, embodiments are expressly contemplated herein in which multiple seal regions are provided and multiple n-doped semiconductor regions 732 are formed within the multiple seal regions. In one embodiment, each n-doped semiconductor region 732 can be formed in the general shape of a ring, i.e., can be topologically homeomorphic to a ring. Each of the at least one n-doped semiconductor region 732 can function as diffusion barrier structures that prevent diffusion of hydrogen atoms therethrough in addition to the diffusion barrier structure(s) provided by direct contact between the silicon nitride liner 762 and the semiconductor substrate 10. Each barrier width bw can be at least 30 nm. Implantation of the n-type dopants into at least one annular region of the semiconductor substrate 10 can be performed prior to, or after, formation of the silicon oxide liner 761. In one embodiment, the n-doped semiconductor region(s) 732 can be formed during formation of other n-doped regions such as n-doped active regions 730 of field effect transistors. The n-doped semiconductor region(s) 732 function as hydrogen traps to reduce hydrogen diffusion to the field effect transistors 702.

Figure 10:
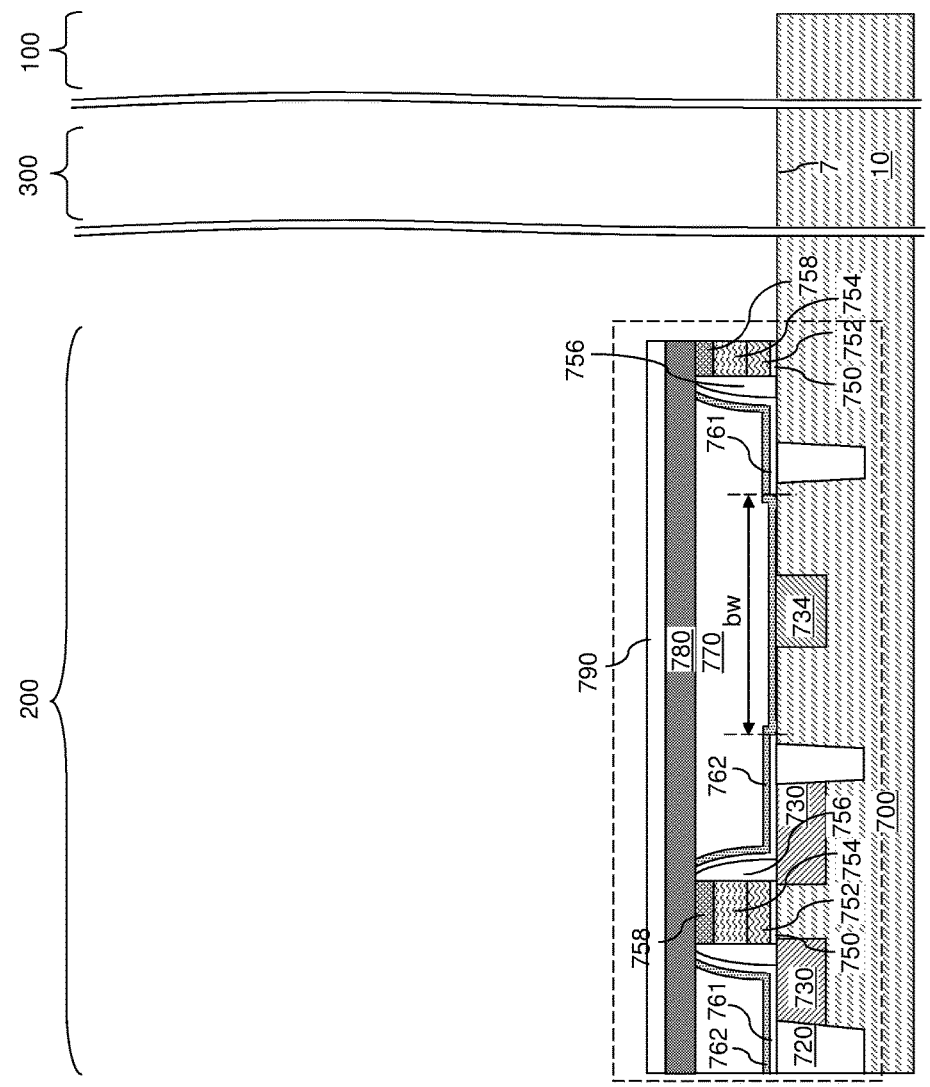
FIG. 10 is a schematic vertical cross-sectional view of a third alternative configuration of the exemplary structure according to an embodiment of the present disclosure at the processing steps of FIG. 7.

Referring to FIG. 10, a third alternative configuration of the exemplary structure can be derived from the exemplary structure of FIG. 7 or from the first configuration of FIG. 8 by forming an electrically doped semiconductor region such as a p-doped semiconductor region 734 within the semiconductor substrate 10 by implanting p-type electrical dopants. The p-doped semiconductor region 734 is formed between an inner periphery and an outer periphery of an annular area (e.g., seal region 781) at which the semiconductor substrate 10 contacts the silicon nitride liner 762. The p-doped semiconductor region 734 is laterally spaced from the silicon oxide liner 761, and contacts a bottom surface of the silicon nitride liner 762. The p-doped semiconductor region 734 is doped with at least one p-type electrical dopant such as boron.

While a single p-doped semiconductor region 734 is illustrated herein, embodiments are expressly contemplated herein in which multiple seal regions are provided and multiple p-doped semiconductor regions 734 are formed within the multiple seal regions. In one embodiment, each p-doped semiconductor region 734 can be topologically homeomorphic to a ring. Each of the at least one p-doped semiconductor region 734 can function as diffusion barrier structures that prevent diffusion of hydrogen atoms therethrough in addition to the diffusion barrier structure(s) provided by direct contact between the silicon nitride liner 762 and the semiconductor substrate 10. Each barrier width bw can be at least 30 nm. Implantation of the p-type dopants into at least one annular region of the semiconductor substrate 10 can be performed prior to, or after, formation of the silicon oxide liner 761. In one embodiment, the p-doped semiconductor region(s) 734 can be formed during formation of other p-doped regions such as p-doped active regions of field effect transistors. The p-doped semiconductor region(s) 734 function as hydrogen traps to reduce hydrogen diffusion to the field effect transistors 702.

Figure 11:
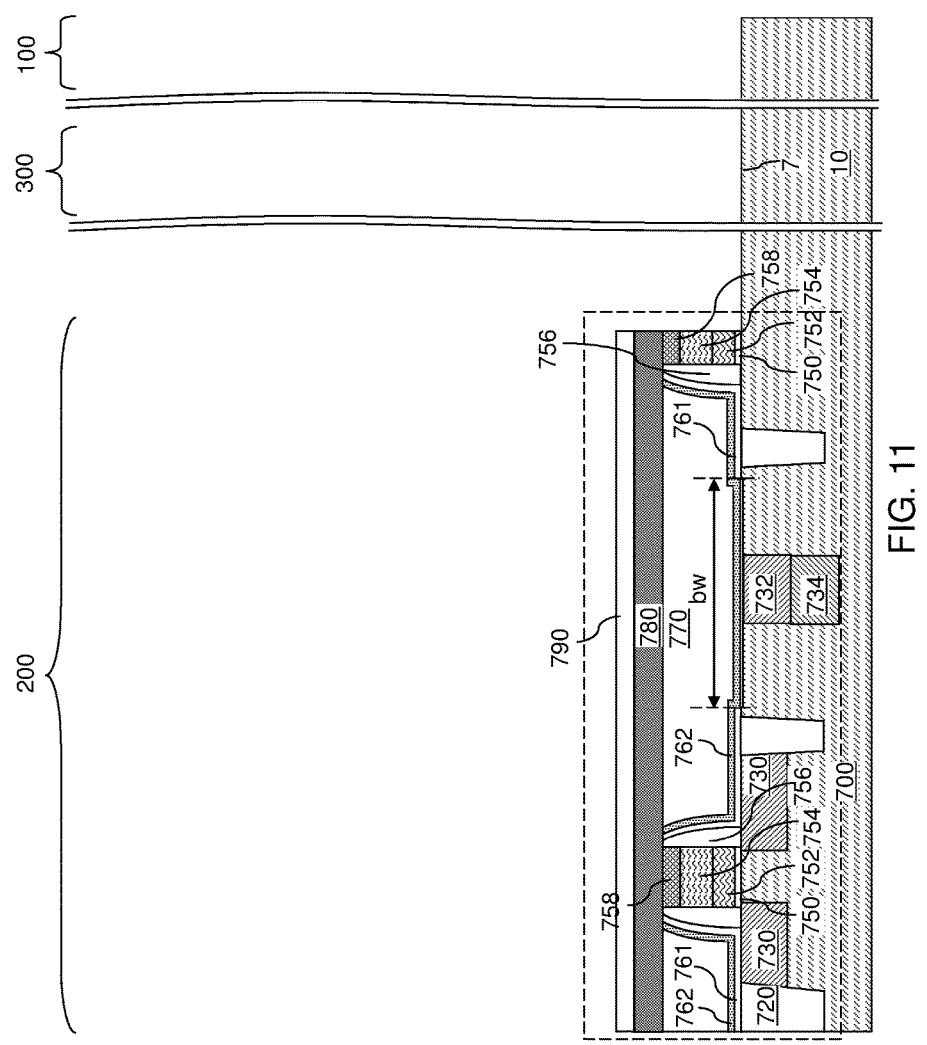
FIG. 11 is a schematic vertical cross-sectional view of a fifth alternative configuration of the exemplary structure according to an embodiment of the present disclosure at the processing steps of FIG. 7.

Referring to FIG. 11, a fourth alternative configuration of the exemplary structure can be derived from the exemplary structure of FIG. 7 or from the first configuration of FIG. 8 by forming an electrically doped buried semiconductor region contacting a bottom surface of an electrically doped semiconductor region. In other words, a vertical stack of an electrically doped buried semiconductor region and an electrically doped semiconductor region can be formed. In one embodiment, the electrically doped semiconductor region can be doped with at least one of phosphorus and arsenic, and the electrically doped buried semiconductor region can be doped with boron.

A vertical stack of a p-doped semiconductor region 734 and an n-doped semiconductor region 732 within the semiconductor substrate 10 can be formed by implanting p-type electrical dopants and n-type electrical dopants with different implantation depths. The vertical stack of the p-doped semiconductor region 734 and the n-doped semiconductor region 732 is formed between an inner periphery and an outer periphery of an annular area (e.g., seal region 781) at which the semiconductor substrate 10 contacts the silicon nitride liner 762. The vertical stack of the p-doped semiconductor region 734 and the n-doped semiconductor region 732 is laterally spaced from the silicon oxide liner 761. The implantation depths of the electrical dopants can be selected such that the n-doped semiconductor region 732 contacts a bottom surface of the silicon nitride liner 762. The p-doped semiconductor region 734 is doped with at least one p-type electrical dopant such as boron. The n-doped semiconductor region 732 is doped with at least one n-type electrical dopant such as phosphorus and/or arsenic.

While a single vertical stack of a p-doped semiconductor region 734 and an n-doped semiconductor region 732 is illustrated herein, embodiments are expressly contemplated herein in which multiple seal regions are provided and multiple vertical stack of a p-doped semiconductor region 734 and an n-doped semiconductor region 732 are formed within the multiple seal regions. In one embodiment, each p-doped semiconductor region 734 can be topologically homeomorphic to a ring, and each n-doped semiconductor region 732 can be topologically homeomorphic to a ring. Each vertical stack of a p-doped semiconductor region 734 and an n-doped semiconductor region 732 can function as diffusion barrier structures that prevent diffusion of hydrogen atoms therethrough in addition to the diffusion barrier structure(s) provided by direct contact between the silicon nitride liner 762 and the semiconductor substrate 10. Each barrier width bw can be at least 30 nm. Implantation of the p-type dopants and the n-type dopants into at least one annular region of the semiconductor substrate 10 can be performed prior to, and/or after, formation of the silicon oxide liner 761.

Figure 12:
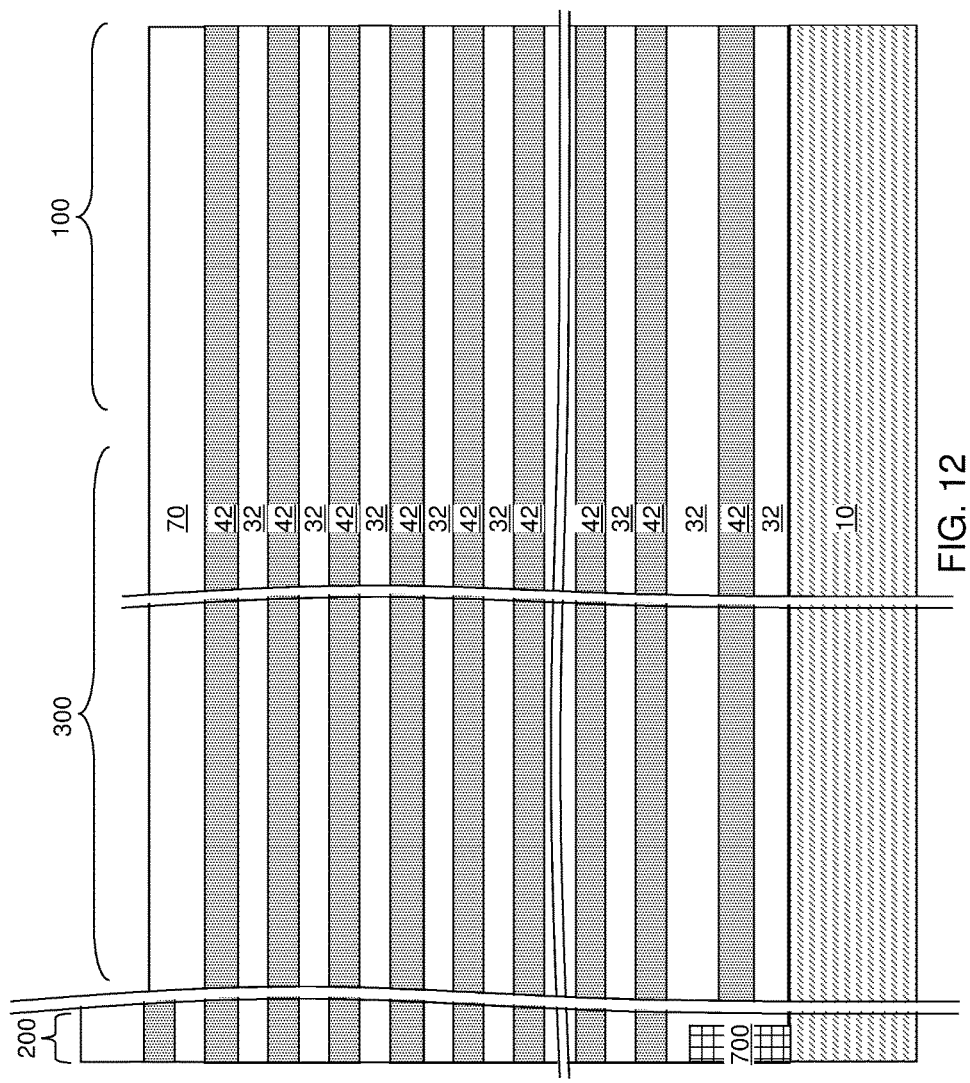
FIG. 12 is a schematic vertical cross-sectional view of the exemplary structure after formation of an alternating stack of insulating layers and sacrificial material layers according to an embodiment of the present disclosure.

Referring to FIG. 12, a stack of an alternating plurality of first material layers (which can be insulating layers 32) and second material layers (which can be sacrificial material layer 42) is formed over the top surface of the substrate 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 13:
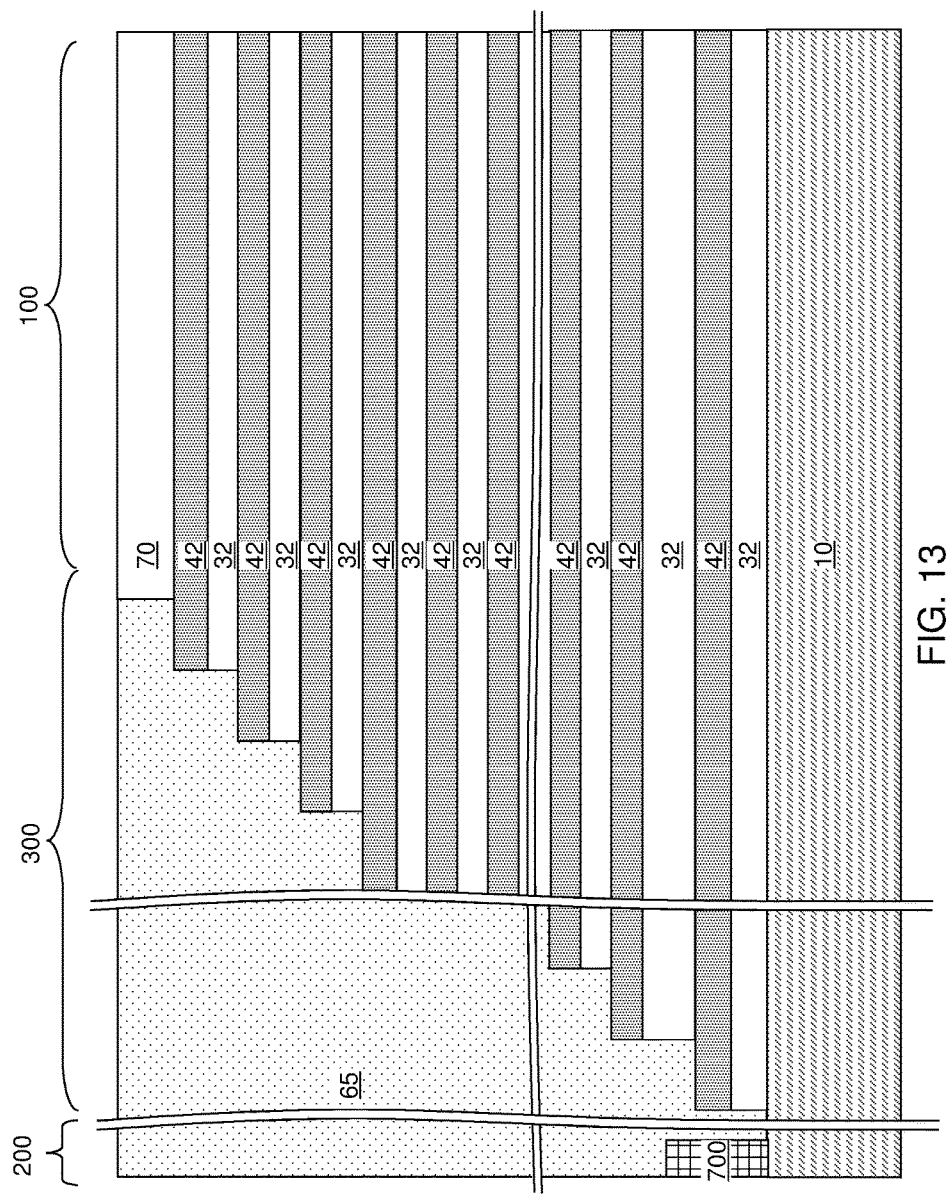
FIG. 13 is a schematic vertical cross-sectional view of the exemplary structure after formation of stepped terraces and a retro-stepped dielectric material portion according to an embodiment of the present disclosure.

Referring to FIG. 13, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 14A:
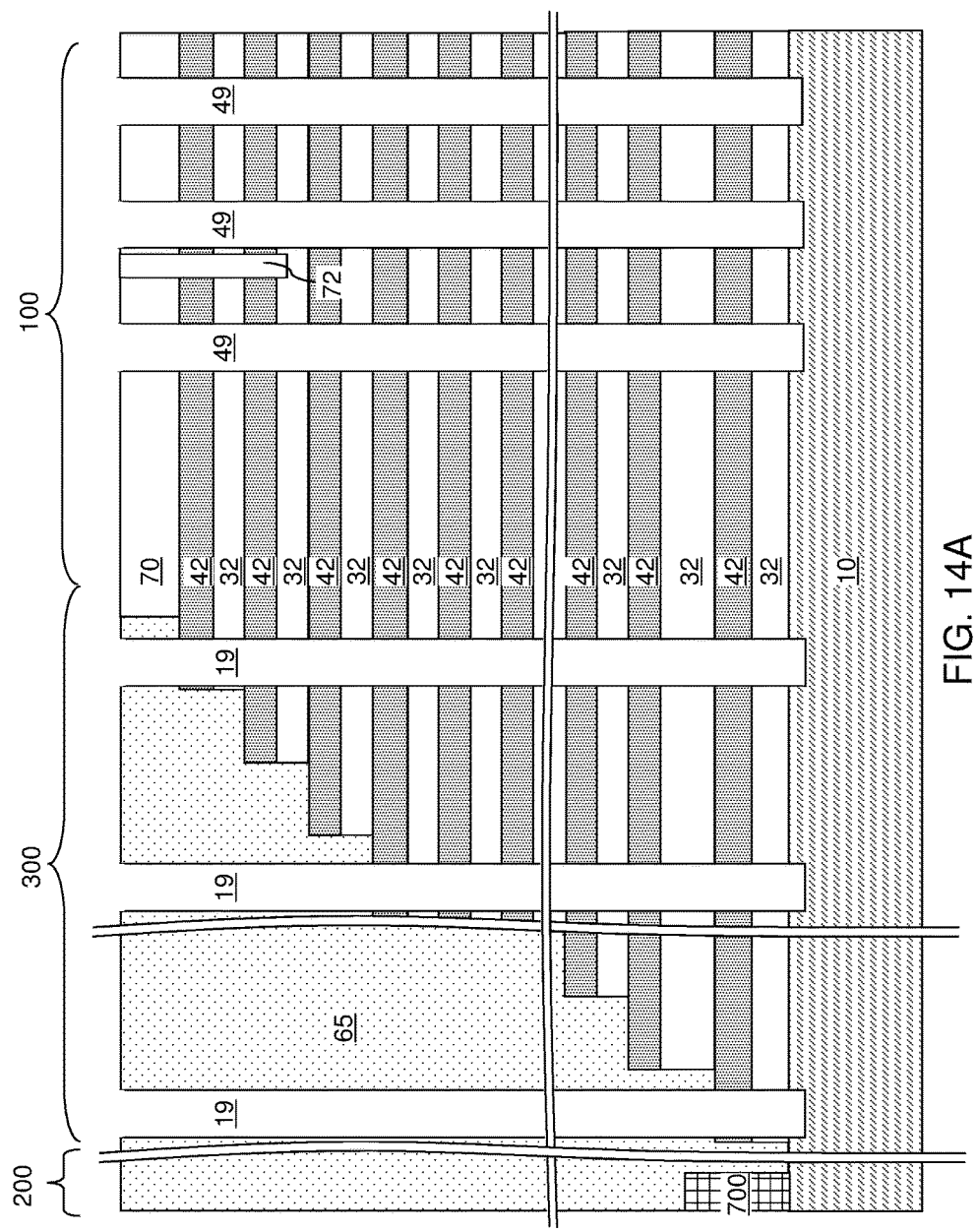
FIG. 14A is a schematic vertical cross-sectional view of the exemplary structure after formation of memory openings and support openings according to an embodiment of the present disclosure.
Figure 14B:
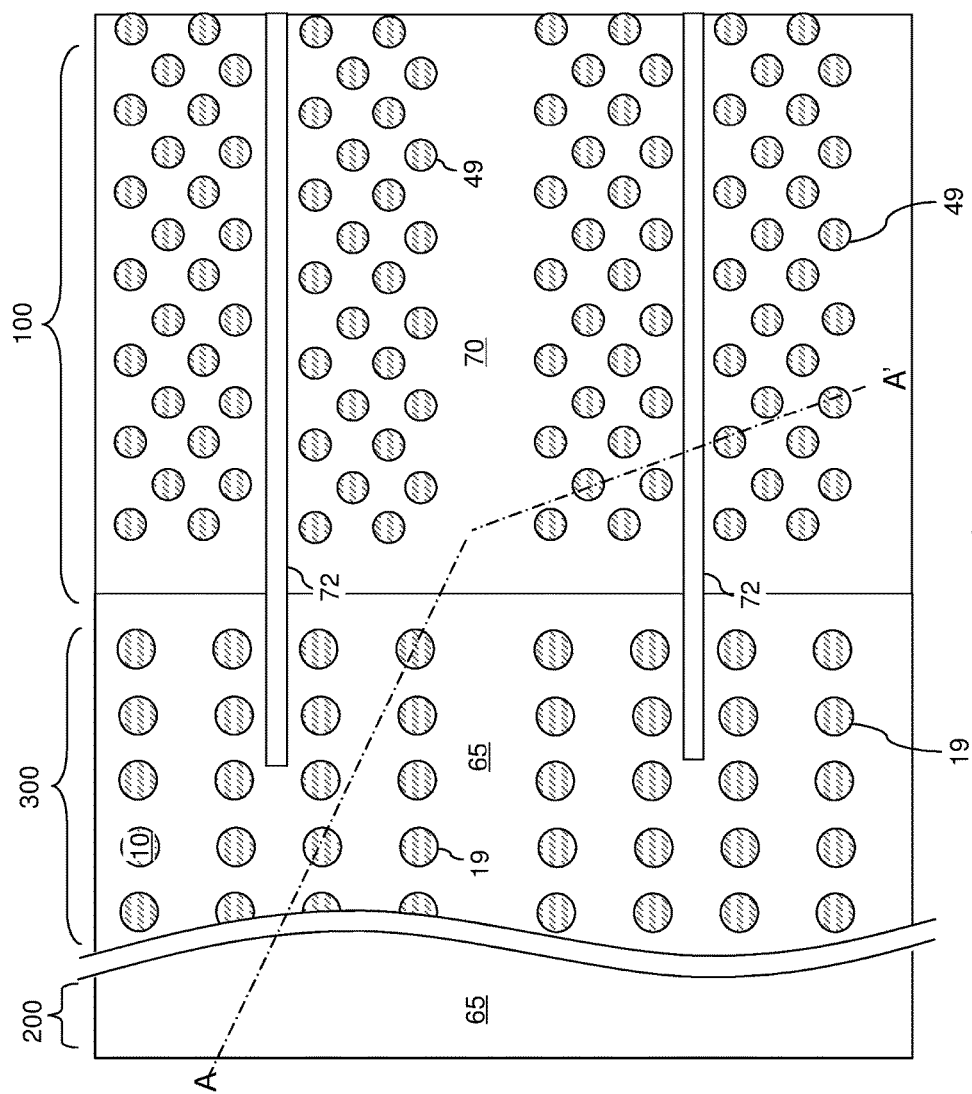
FIG. 14B is a top-down view of the exemplary structure of FIG. 14A. The vertical plane A-A' is the plane of the cross-section for FIG. 14A.

Referring to FIGS. 14A and 14B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor substrate 10. In one embodiment, an overetch into the semiconductor substrate 10 may be optionally performed after the top surface of the semiconductor substrate 10 is physically exposed at a bottom of each memory opening 49 and each support opening 19. The overetch may be performed prior to, or after, removal of the lithographic material stack. In other words, the recessed surfaces of the semiconductor substrate 10 may be vertically offset from the un-recessed top surfaces of the semiconductor substrate 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor substrate 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The semiconductor substrate 10 and the semiconductor substrate 10 collectively constitutes a substrate 10, which can be a semiconductor substrate. Alternatively, the semiconductor substrate 10 may be omitted, and the memory openings 49 and the support openings 19 can be extend to a top surface of the semiconductor substrate 10.

FIGS. 15A-15H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 15A, a memory opening 49 in the exemplary device structure of FIGS. 14A and 14B is illustrated. The memory opening 49 extends through the insulating cap layer 70, the alternating stack (32, 42), and optionally into an upper portion of the semiconductor substrate 10. At this processing step, each support opening 19 can extend through the retro-stepped dielectric material portion 65, a subset of layers in the alternating stack (32, 42), and optionally through the upper portion of the semiconductor substrate 10. The recess depth of the bottom surface of each memory opening with respect to the top surface of the semiconductor substrate 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 15B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor substrate 10. In one embodiment, the pedestal channel portion 11 can be doped with electrical dopants of the same conductivity type as the semiconductor substrate 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate 10 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor substrate 10 that the pedestal channel portion contacts. If a semiconductor substrate 10 is not present, the pedestal channel portion 11 can be formed directly on the semiconductor substrate 10, which can have a doping of the first conductivity type.

Referring to FIG. 15C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 15D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor substrate 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor substrate 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 15E, a second semiconductor channel layer 602 can be deposited directly on the semiconductor surface of the pedestal channel portion 11 or the semiconductor substrate 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 15F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 15G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 15H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20. See FIG. 6.

Figure 16:
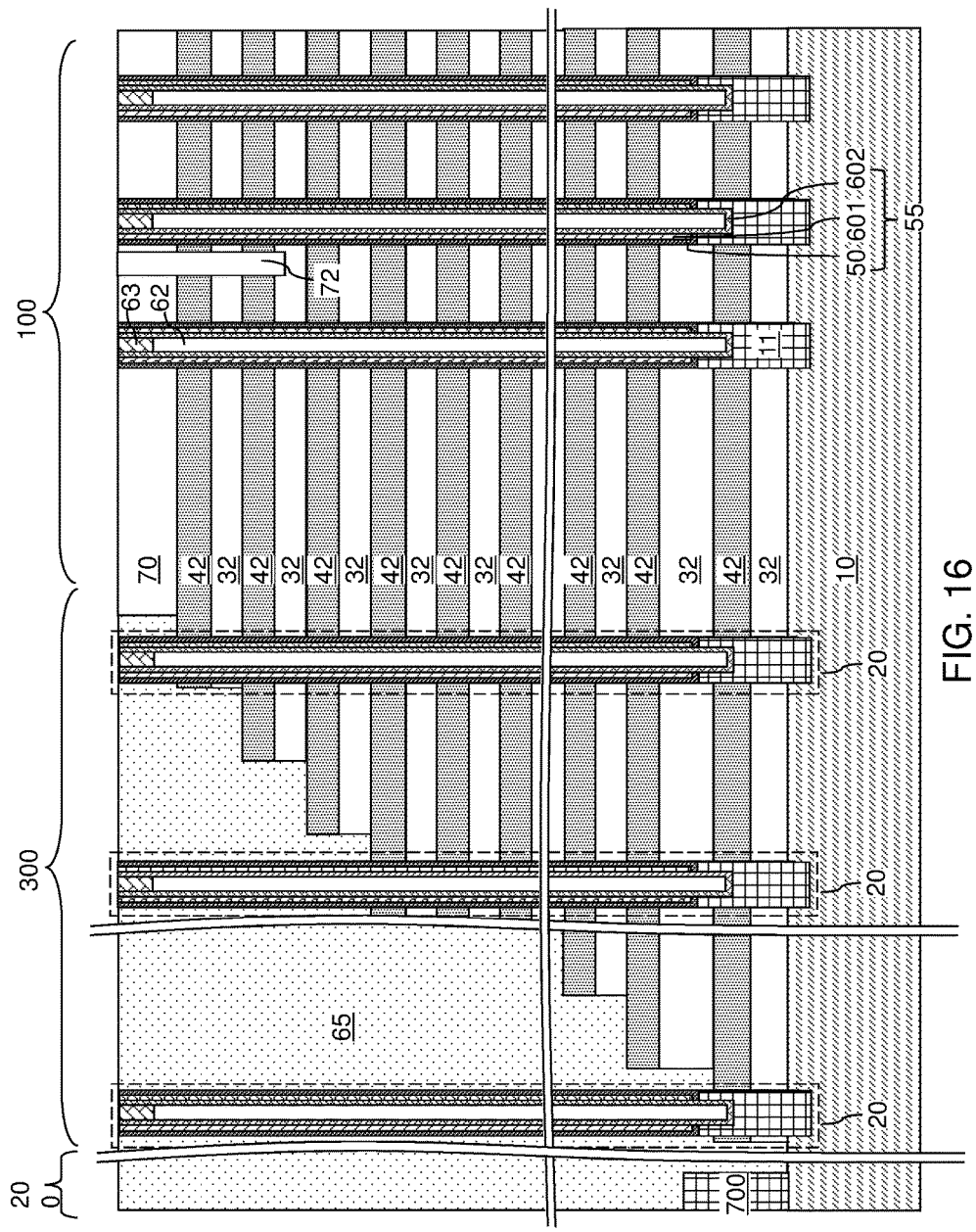
FIG. 16 is a schematic vertical cross-sectional view of the exemplary structure after formation of memory stack structures and support pillar structures according to an embodiment of the present disclosure.

Referring to FIG. 16, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 14A and 14B. An instance of the support pillar structure 20 can be formed within each support opening 19 of the structure of FIGS. 14A and 14B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 17A:
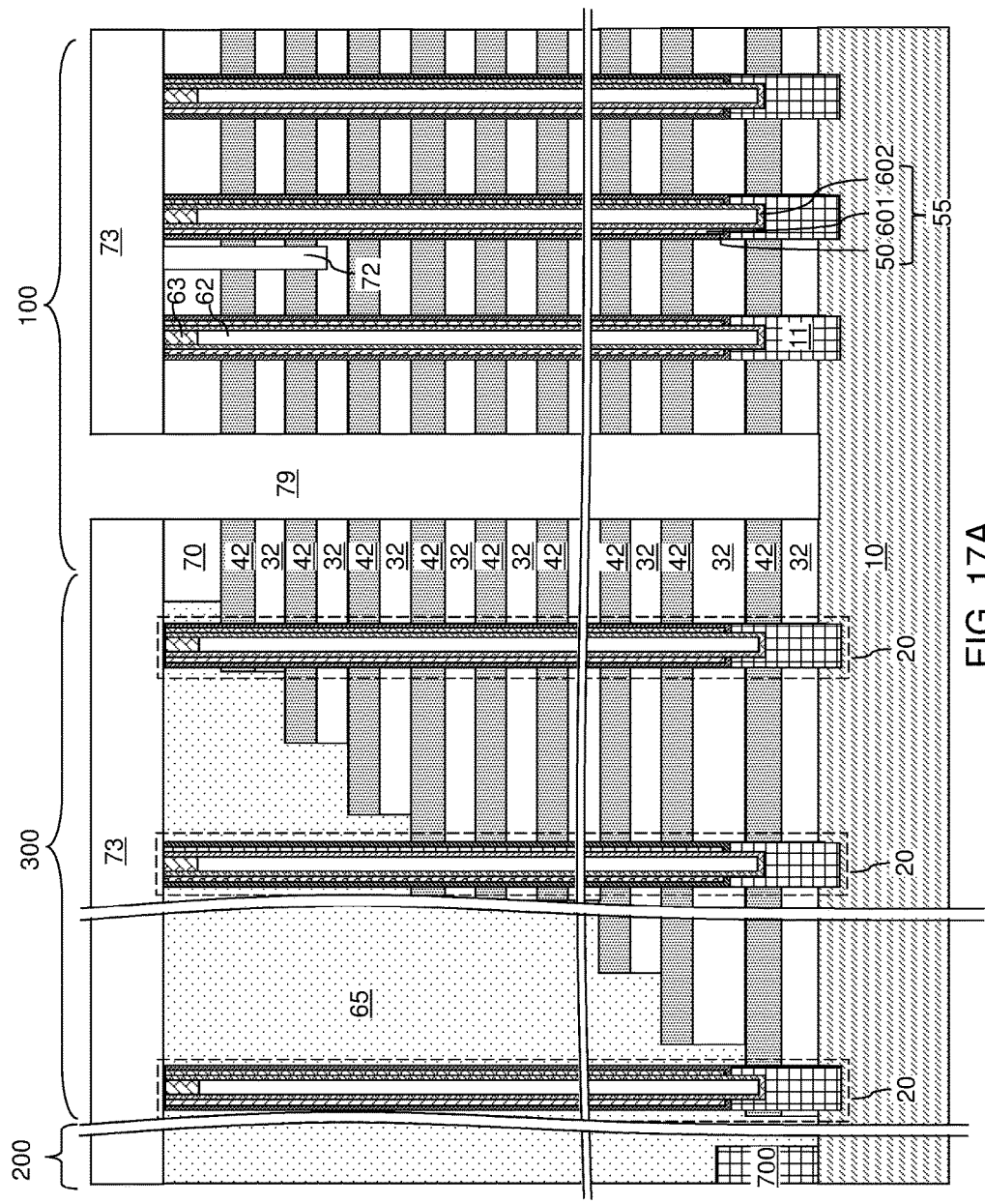
FIG. 17A is a schematic vertical cross-sectional view of the exemplary structure after formation of backside trenches according to an embodiment of the present disclosure.
Figure 17B:
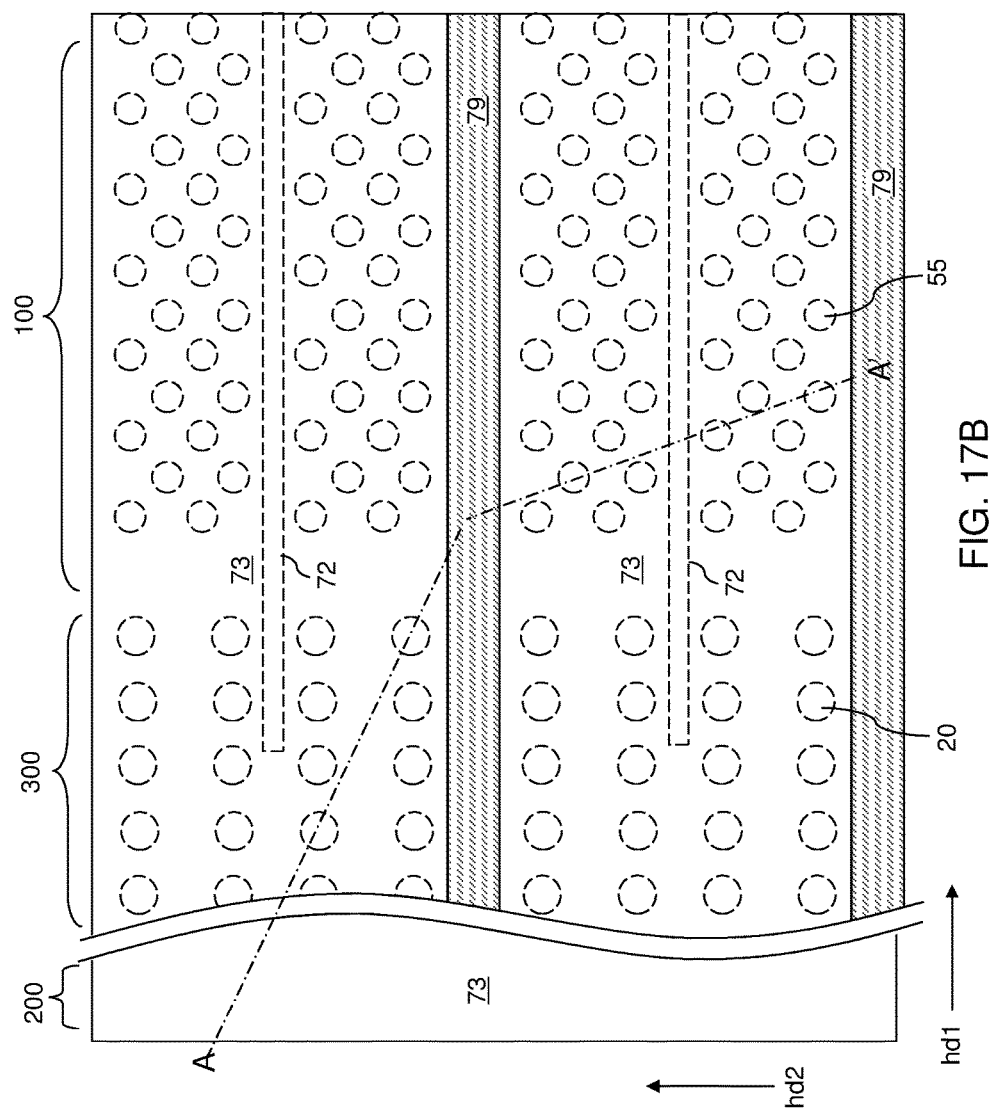
FIG. 17B is a partial see-through top-down view of the exemplary structure of FIG. 17A. The vertical plane A-A' is the plane of the schematic vertical cross-sectional view of FIG. 17A.

Referring to FIGS. 17A and 17B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate 10, and laterally extend through the memory array region 100 and the contact region 300.

In one embodiment, the backside trenches 79 can laterally extend along a first horizontal direction hd1 (e.g., word line direction) and can be laterally spaced apart among one another along a second horizontal direction hd2 (e.g., bit line direction) that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. The memory stack structures 55 located between each neighboring pair of backside trenches 79 can be configured as a memory block or string. In one embodiment, the backside trenches 79 can include a source contact opening in which a source contact via structure can be subsequently formed. The photoresist layer can be removed, for example, by ashing.

Each vertical step of the stepped surfaces can have the height of one or more pairs of an insulating layer 32 and a sacrificial material layer 42. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. For example, two columns of staircases are formed for each block of memory stack structures such that one column of staircases provide physically exposed top surfaces for odd-numbered sacrificial material layers 42 (as counted from the bottom) and another column of staircases provide physically exposed top surfaces for even-numbered sacrificial material layers 42 (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

Figure 18:
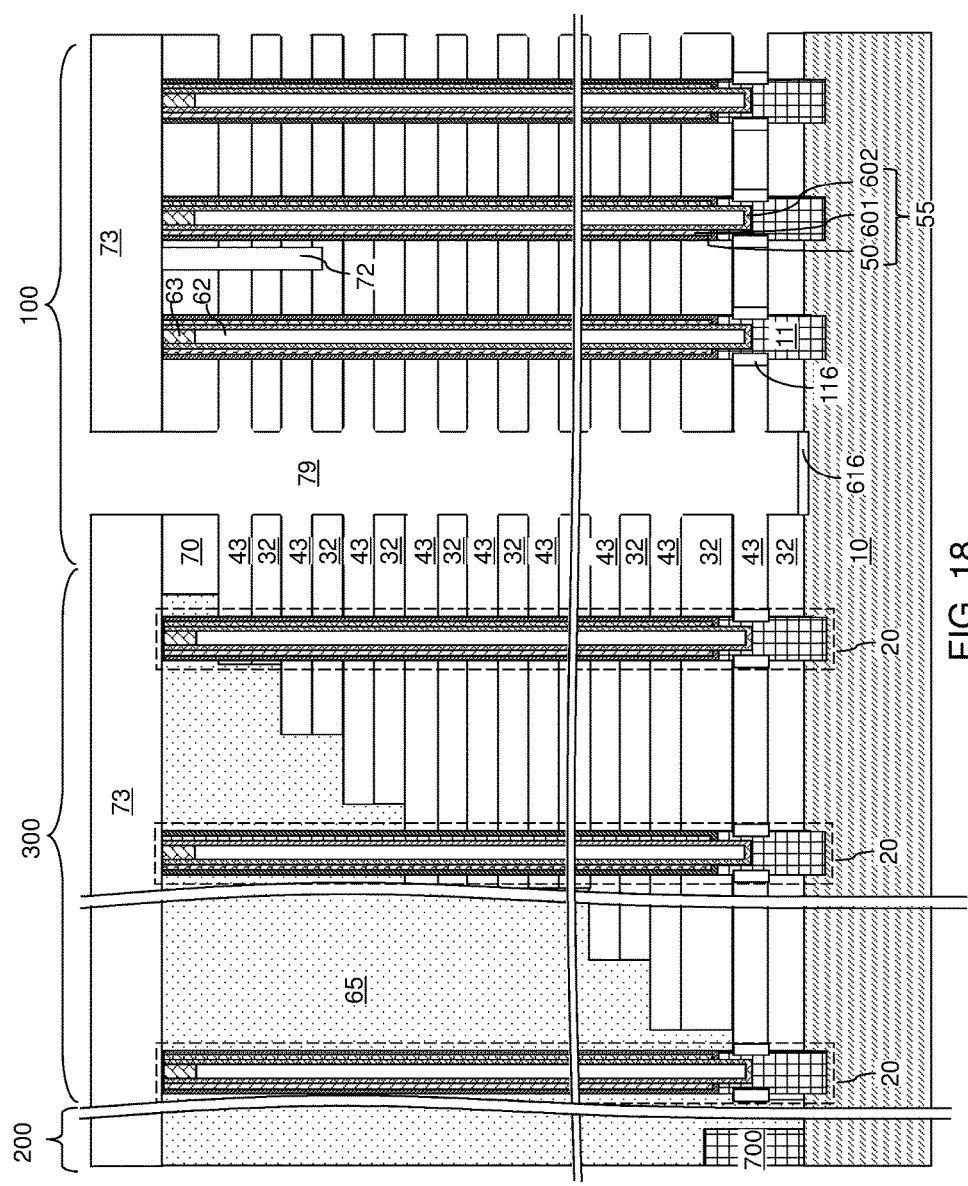
FIG. 18 is a schematic vertical cross-sectional view of the exemplary structure after formation of backside recesses according to an embodiment of the present disclosure.

Referring to FIGS. 18 and 19A, an etchant that selectively etches the second material of the sacrificial material layers 42 with respect to the first material of the insulating layers 32 can be introduced into the backside trenches 79, for example, employing an etch process. FIG. 19A illustrates a region of the exemplary structure of FIG. 18. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor substrate 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate 10. In this case, each backside recess 43 can define a space for receiving a respective word line of the array of monolithic three-dimensional NAND strings.

Each of the plurality of backside recesses 43 can extend substantially parallel to the top surface of the substrate 10. A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor substrate 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor substrate 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor substrate and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor substrate 10.

Referring to FIG. 19B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 19D:
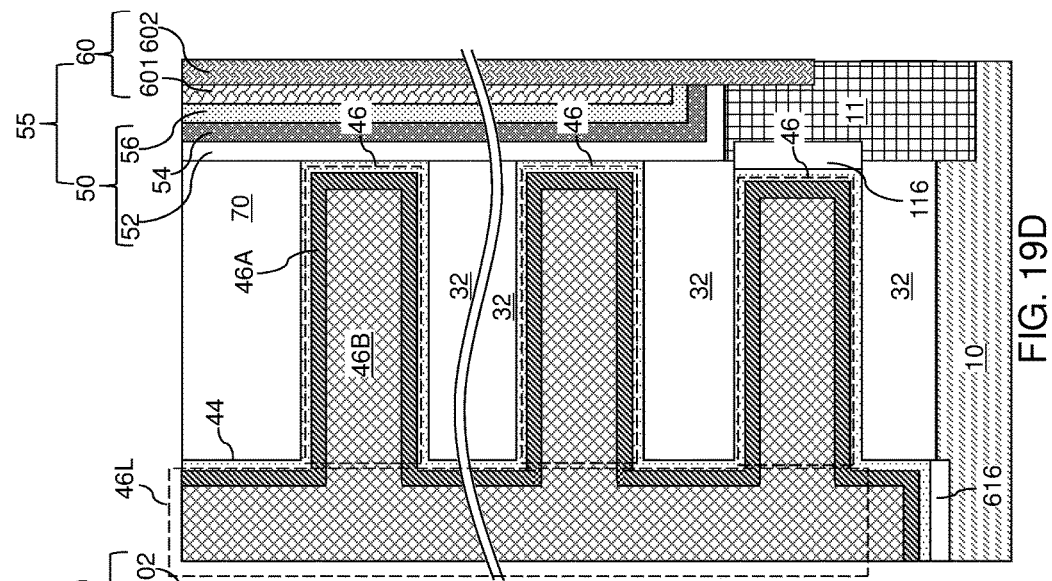
Figure 19C:
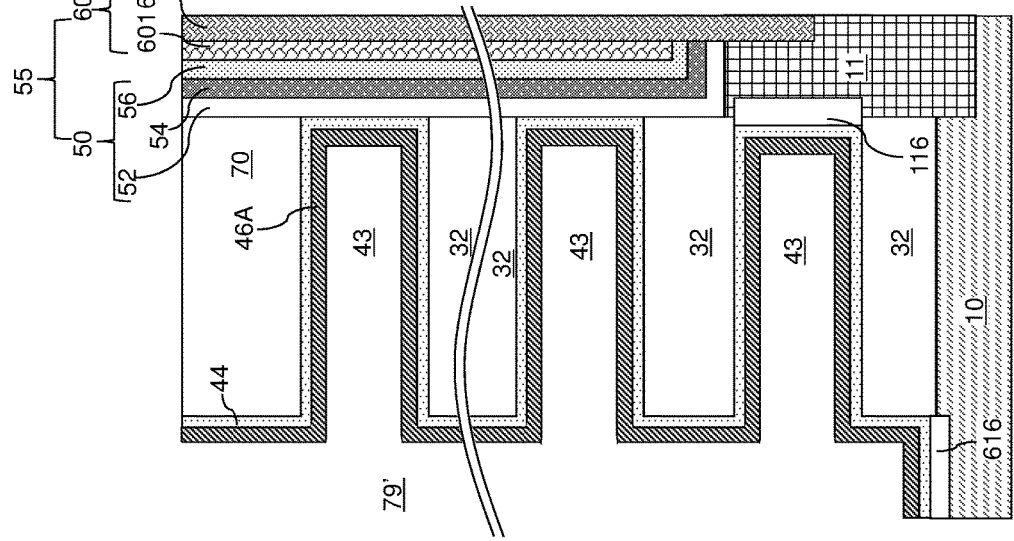

Referring to FIG. 19C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 20:
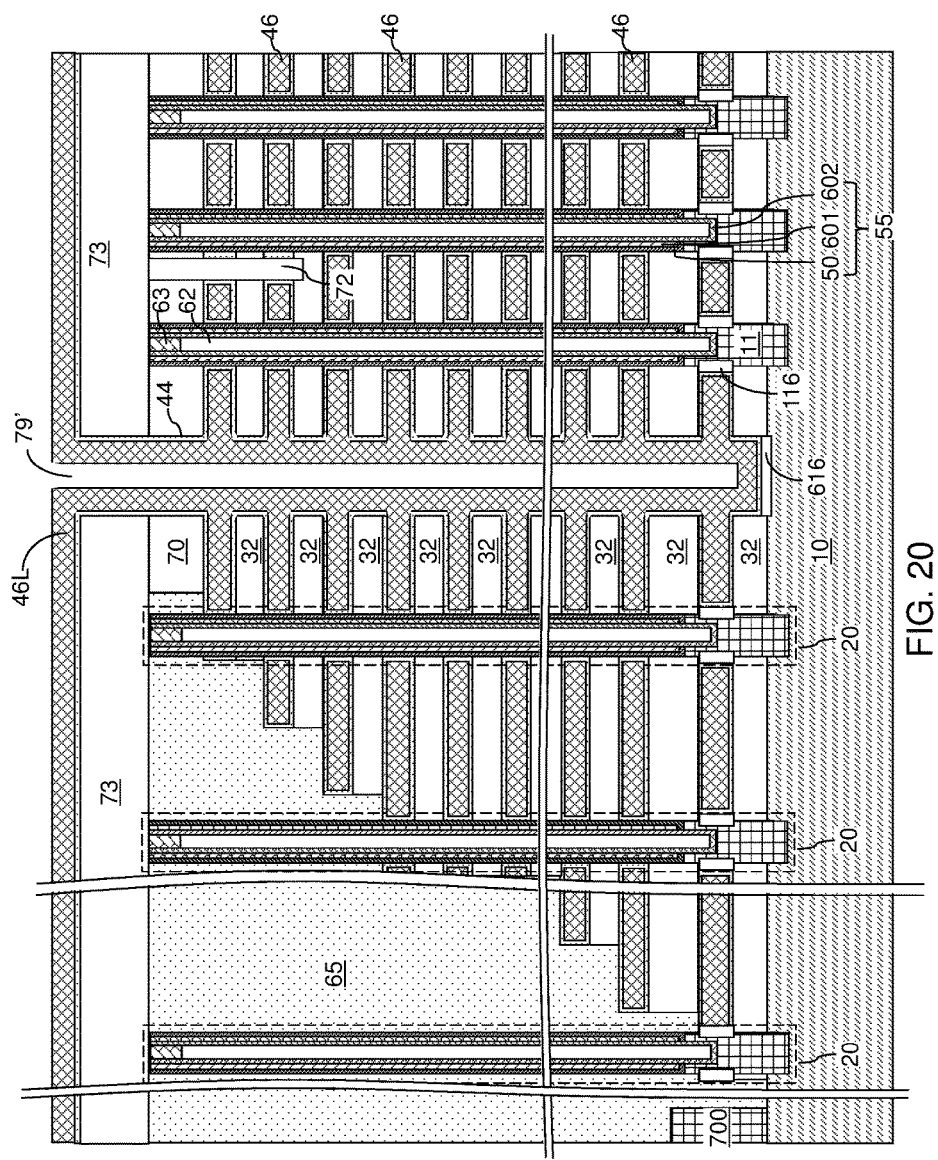
FIG. 20 is a schematic vertical cross-sectional view of the exemplary structure at the processing step of FIG. 19D.

Referring to FIGS. 19D and 20, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 21A:
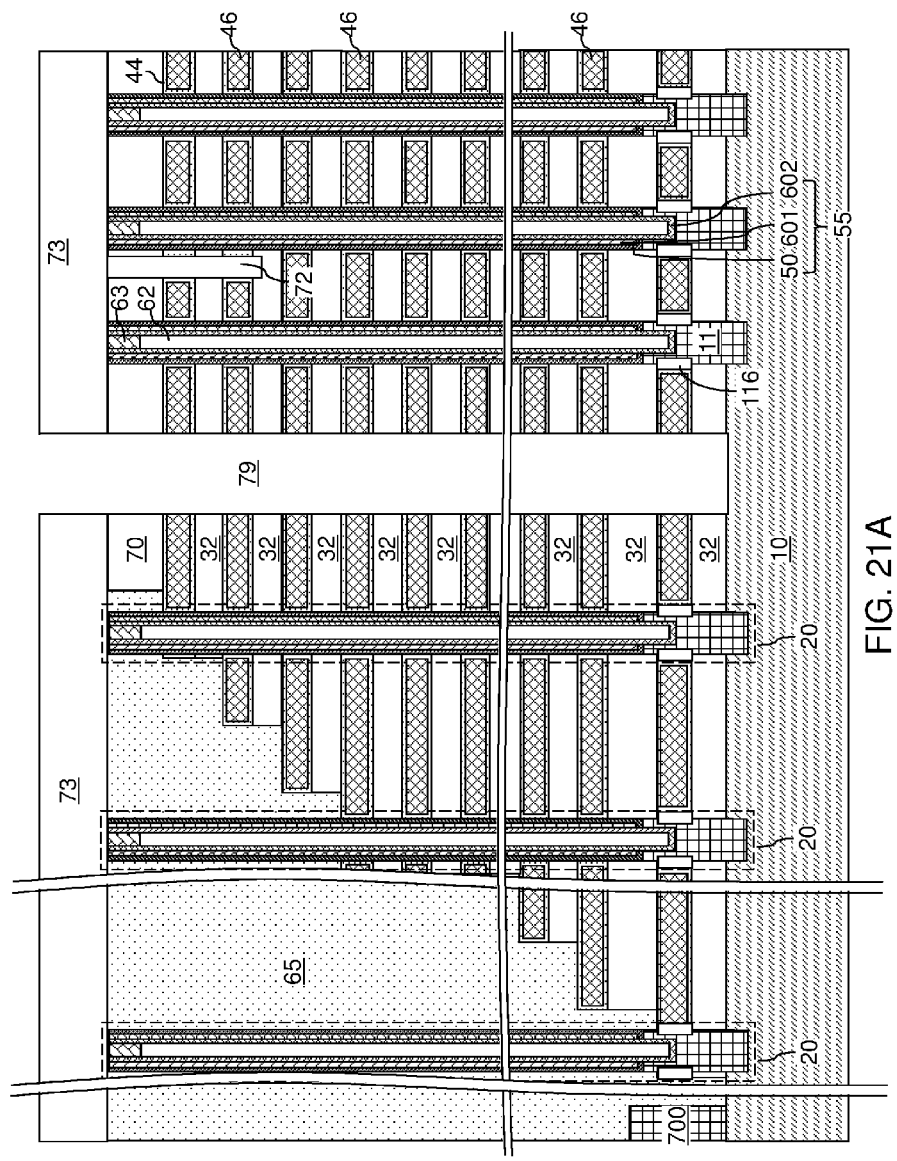
FIG. 21A is a schematic vertical cross-sectional view of the exemplary structure after removal of a deposited conductive material from within the backside trench according to an embodiment of the present disclosure.
Figure 21B:
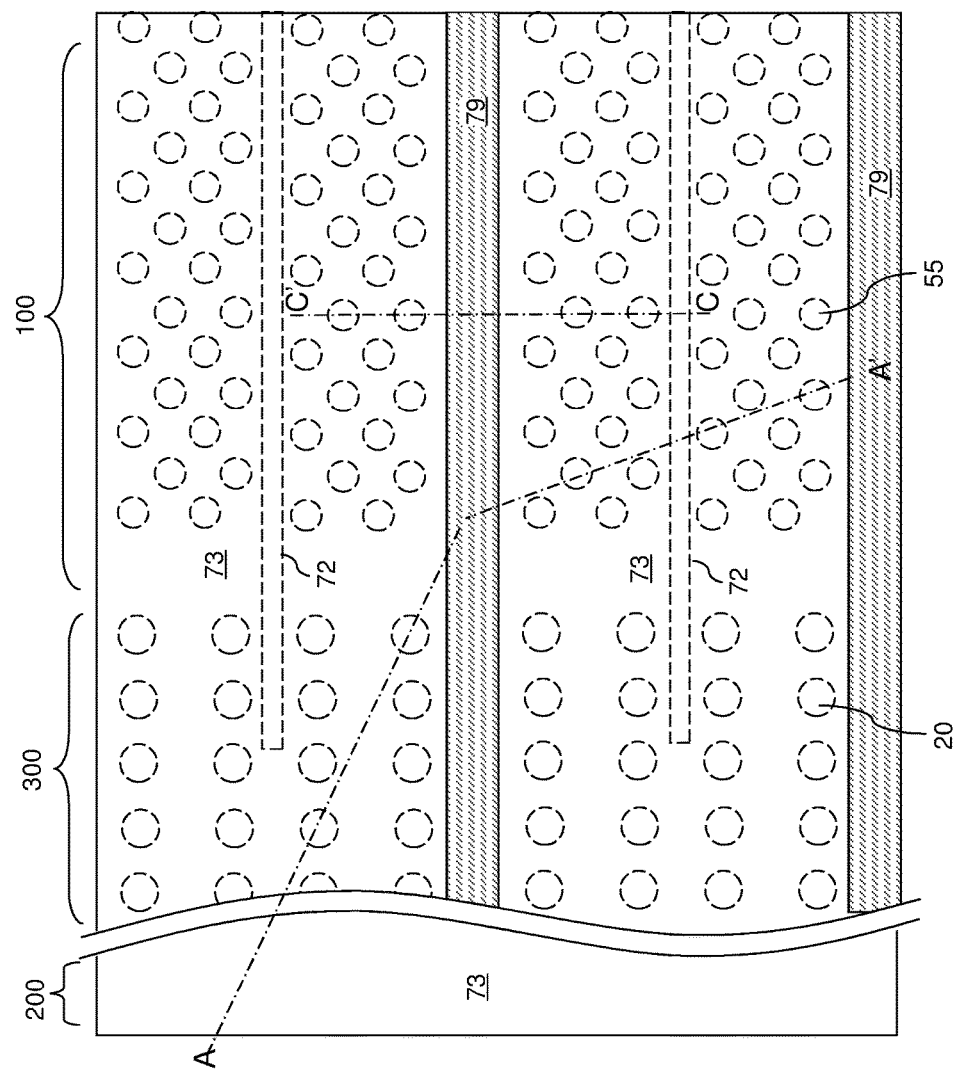
FIG. 21B is a top-down view of the exemplary structure of FIG. 21A.
Figure 21C:
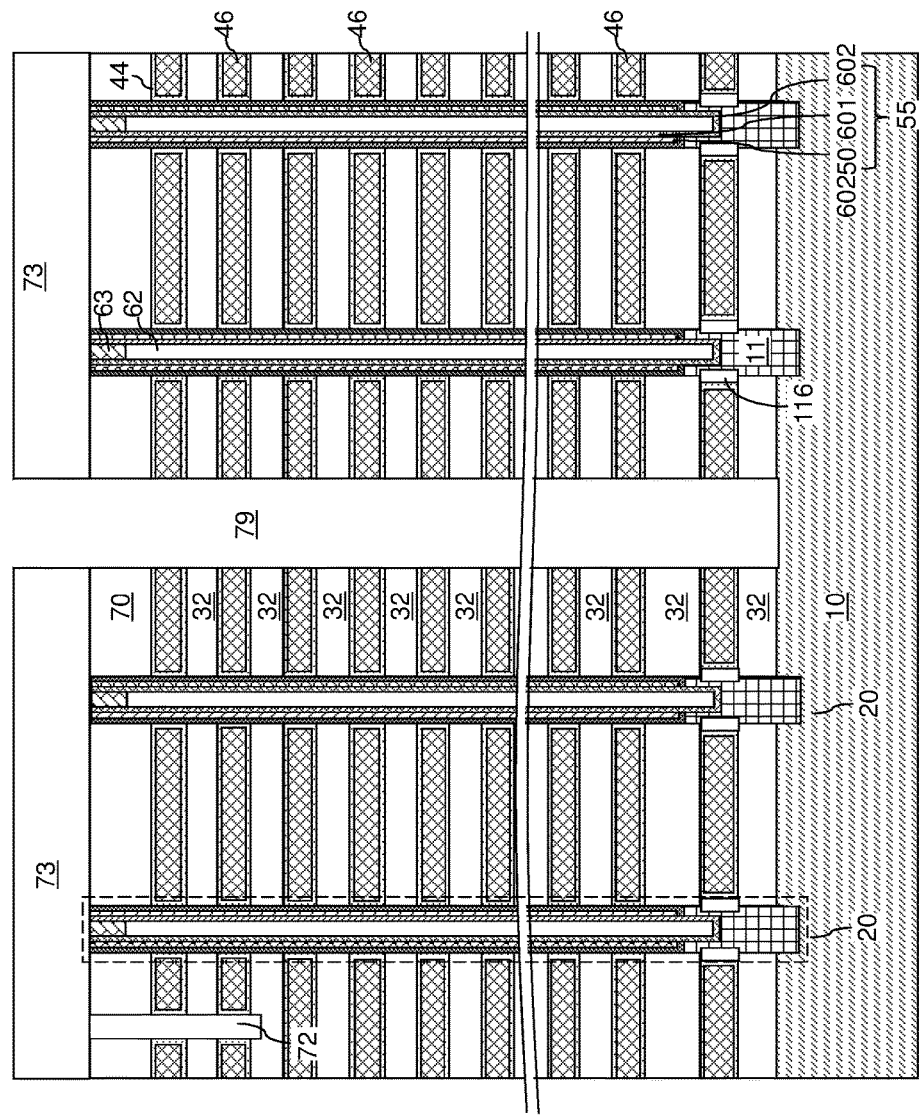
FIG. 21C is a magnified view of a region of the exemplary structure of FIG. 21A.

Referring to FIGS. 21A-21C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 22A:
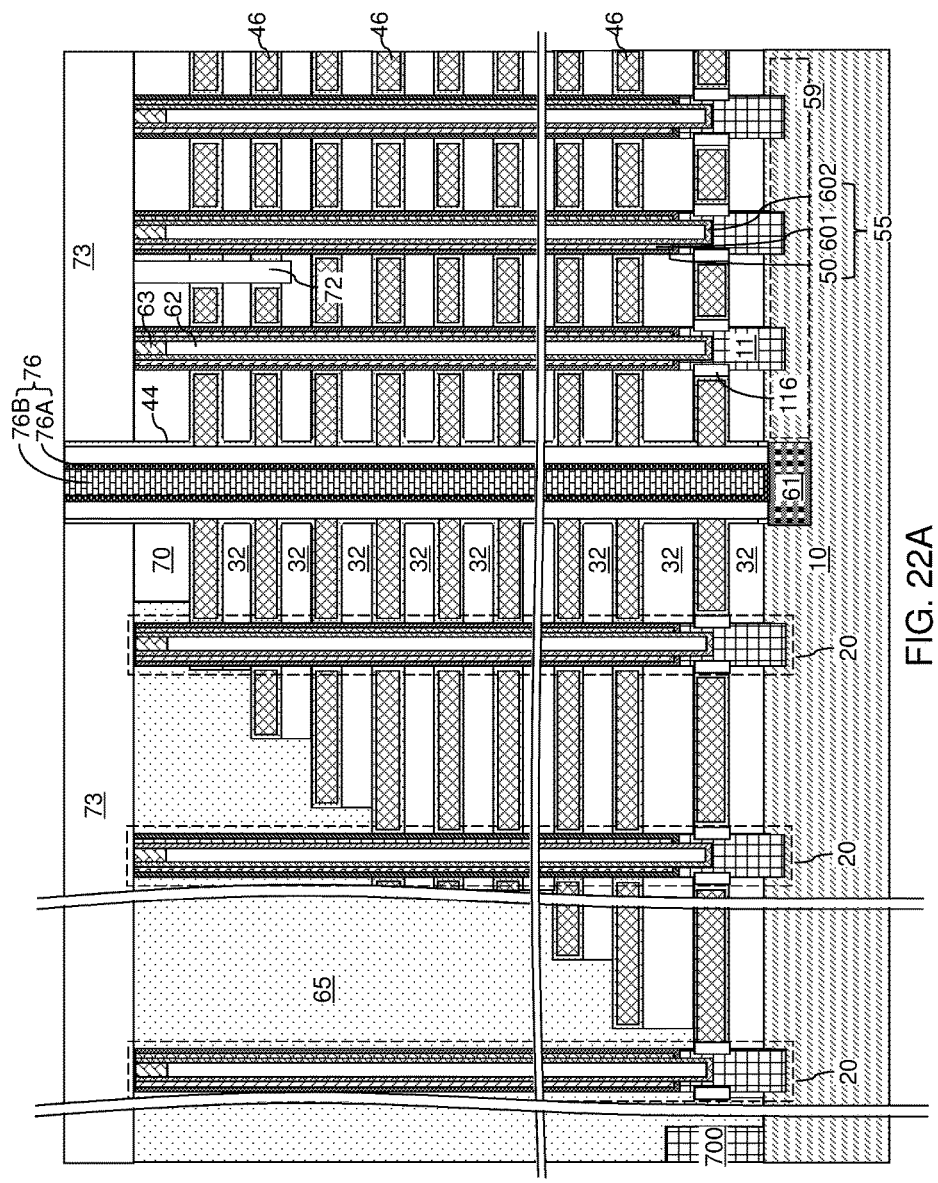
FIG. 22A is a schematic vertical cross-sectional view of the exemplary structure after formation of an insulating spacer and a backside contact structure according to an embodiment of the present disclosure.
Figure 22B:
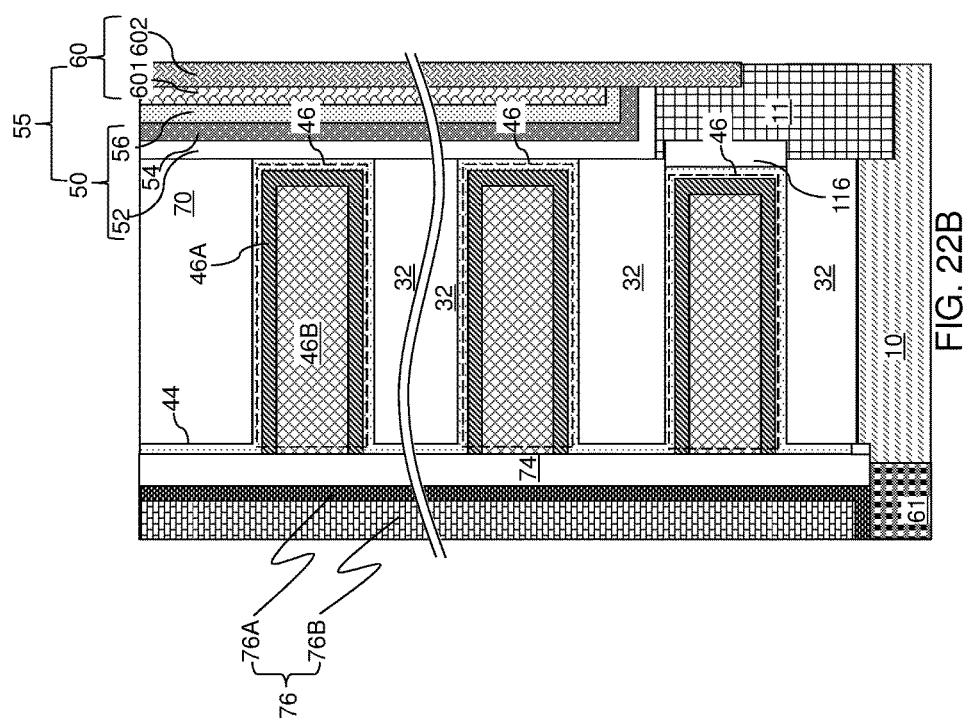
FIG. 22B is a magnified view of a region of the exemplary structure of FIG. 22A.

Referring to FIGS. 22A and 22B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor substrate 10 can be physically exposed at the bottom of each backside trench 79.

A source region 61 can be formed at a surface portion of the semiconductor substrate 10 under each backside cavity 79' by implantation of electrical dopants into physically exposed surface portions of the semiconductor substrate 10. Each source region 61 is formed in a surface portion of the substrate 10 that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor substrate 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate 10. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structures 76 extend through the alternating stack (32, 46), and contact a top surface of the source region 61. If a backside blocking dielectric layer 44 is employed, the backside contact via structures 76 can contact a sidewall of the backside blocking dielectric layer 44.

Figure 23A:
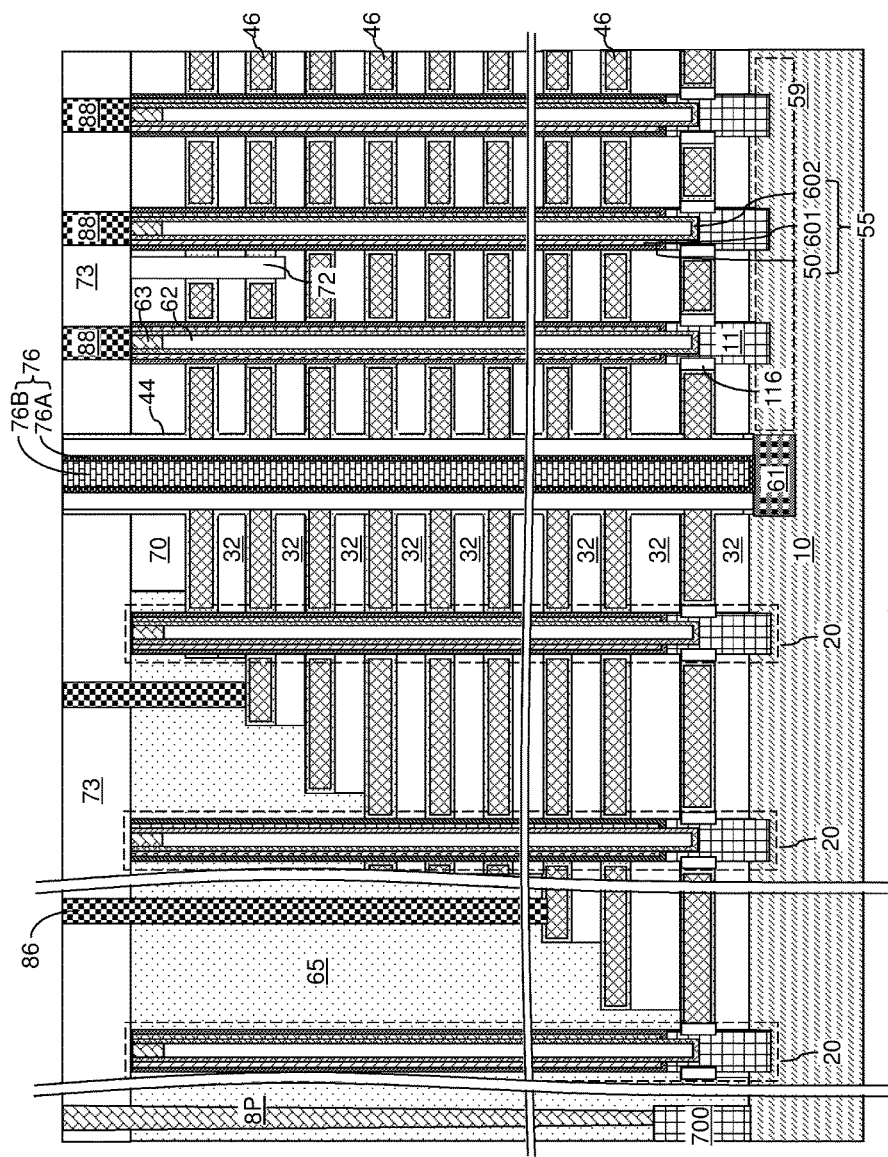
FIG. 23A is a schematic vertical cross-sectional view of the exemplary structure after formation of additional contact via structures according to an embodiment of the present disclosure.
Figure 23B:
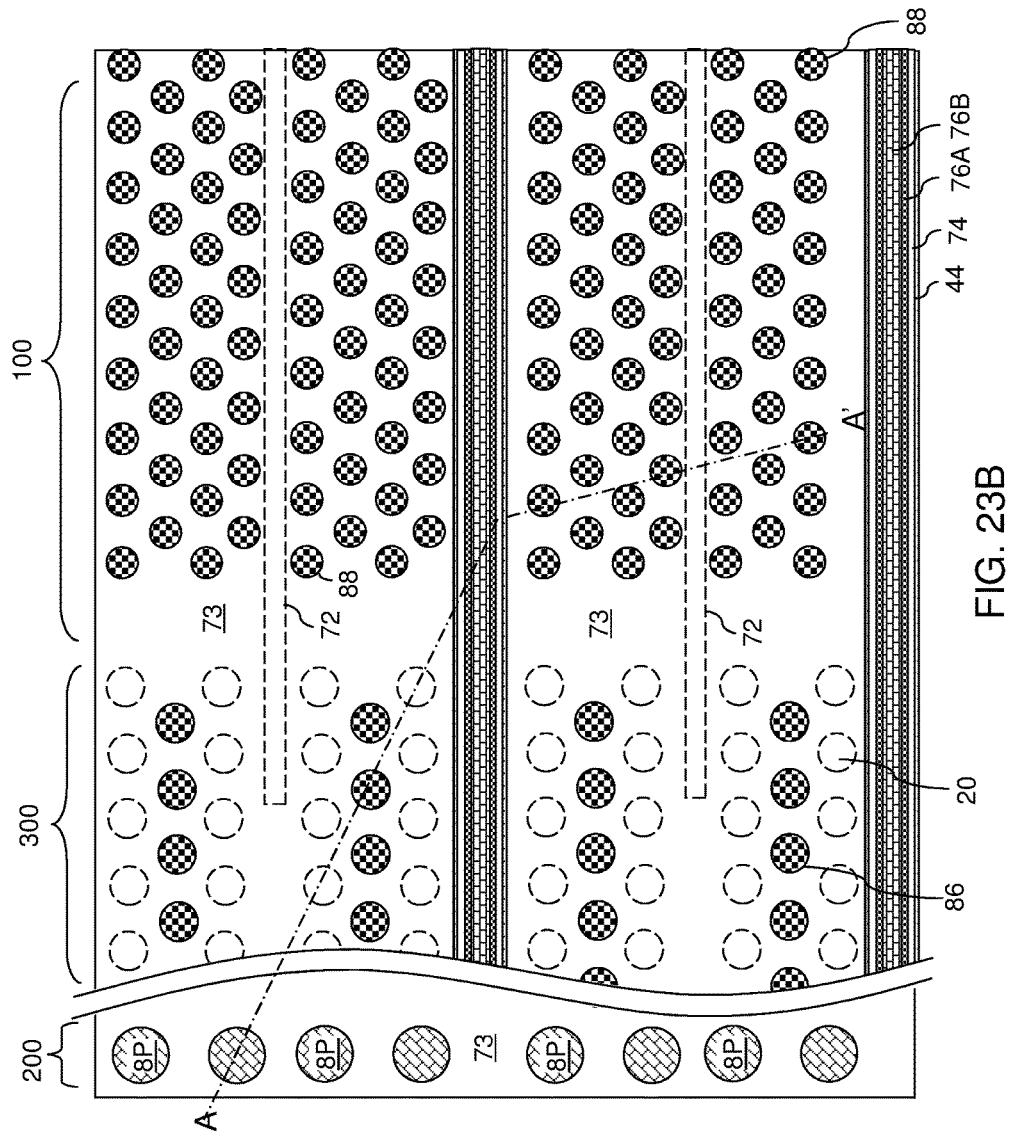
FIG. 23B is a top-down view of the exemplary structure of FIG. 23A. The vertical plane A-A' is the plane of the schematic vertical cross-sectional view of FIG. 23A.

Referring to FIGS. 23A and 23B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices. The three-dimensional memory structure including an array of memory stack structures 55 is located in the memory array region 100, and is laterally spaced from the field effect transistors in the peripheral device region 200 by a silicon oxide material portion such as the retro-stepped dielectric material portion 65.

Figure 24:
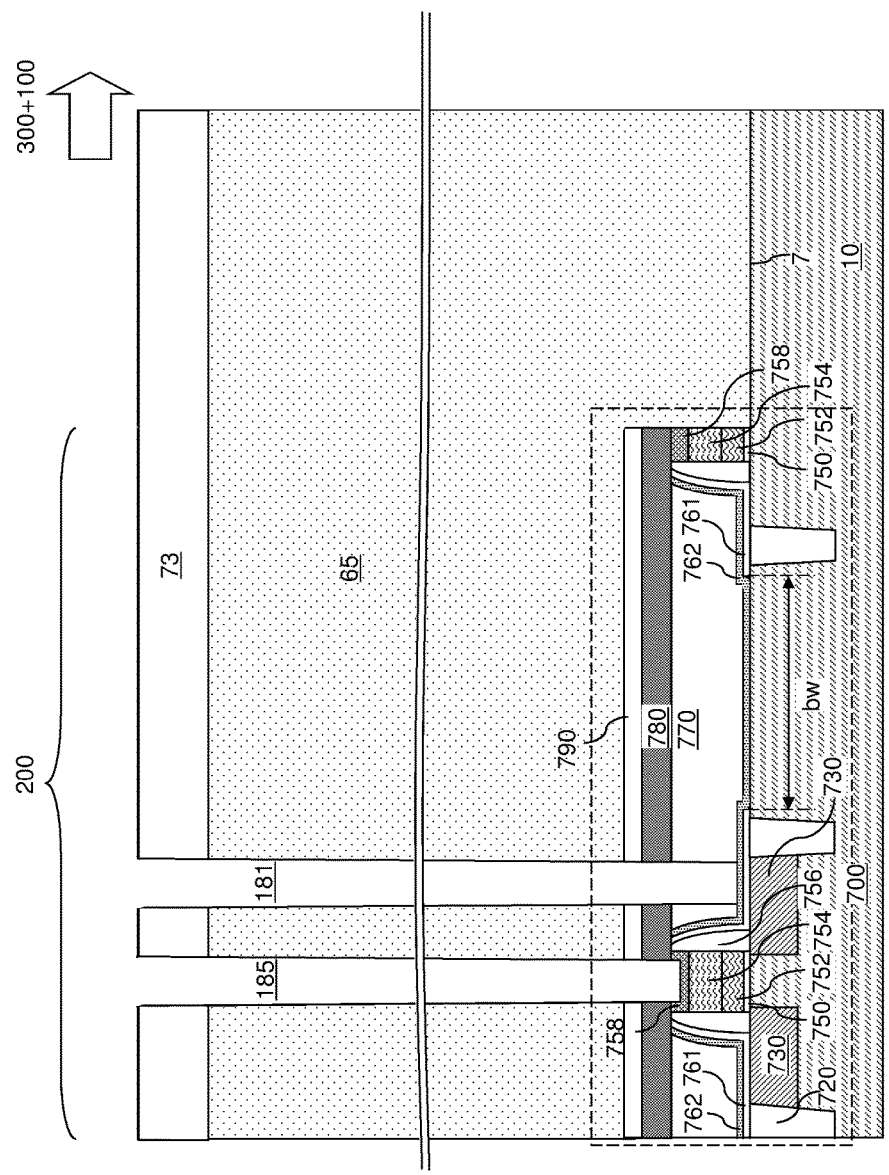
FIG. 24 is a vertical cross-sectional view of a peripheral device region of the exemplary structure during formation of peripheral contact via cavities according to an embodiment of the present disclosure.
Figure 25:
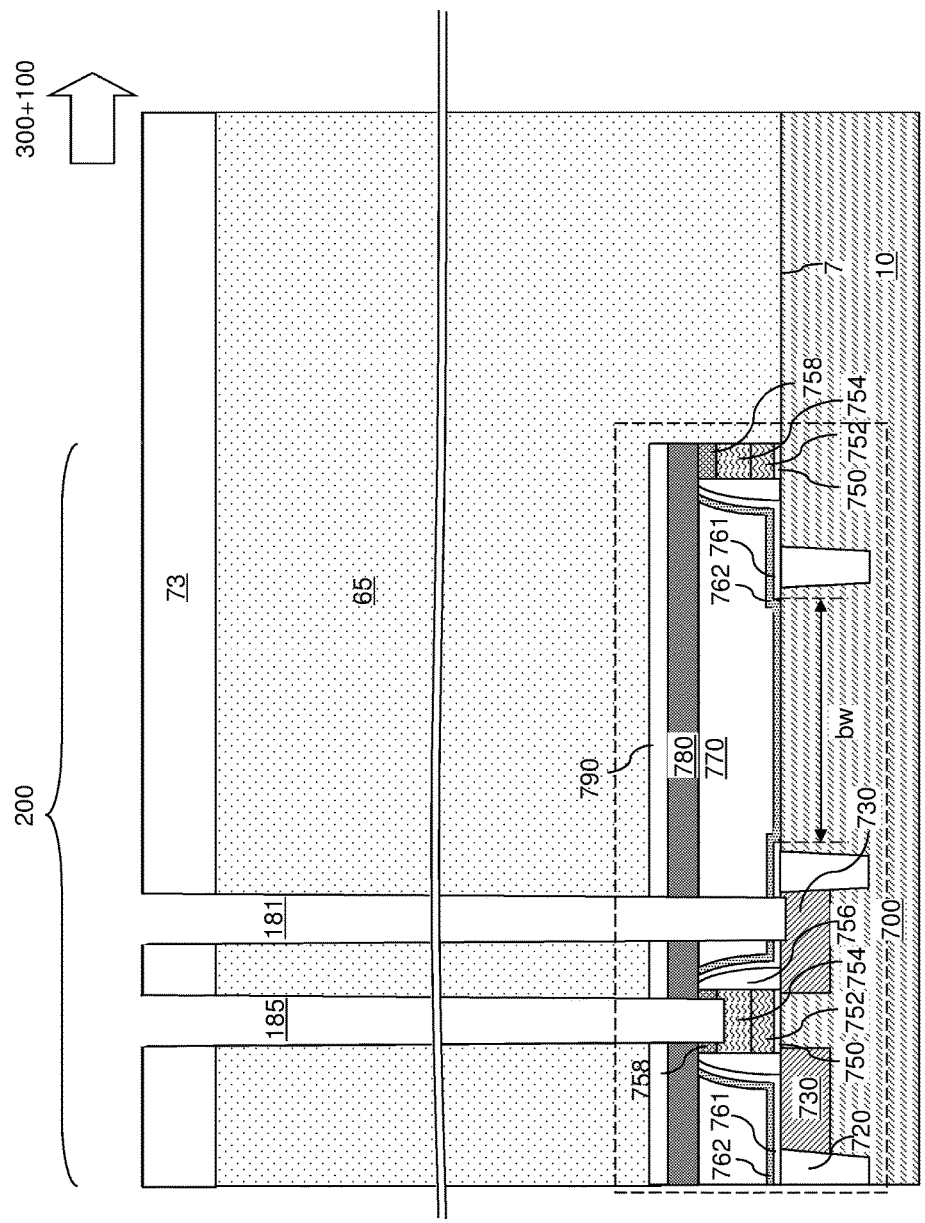
FIG. 25 is a vertical cross-sectional view of the peripheral device region of the exemplary structure after formation of the peripheral contact via cavities according to an embodiment of the present disclosure.
Figure 26:
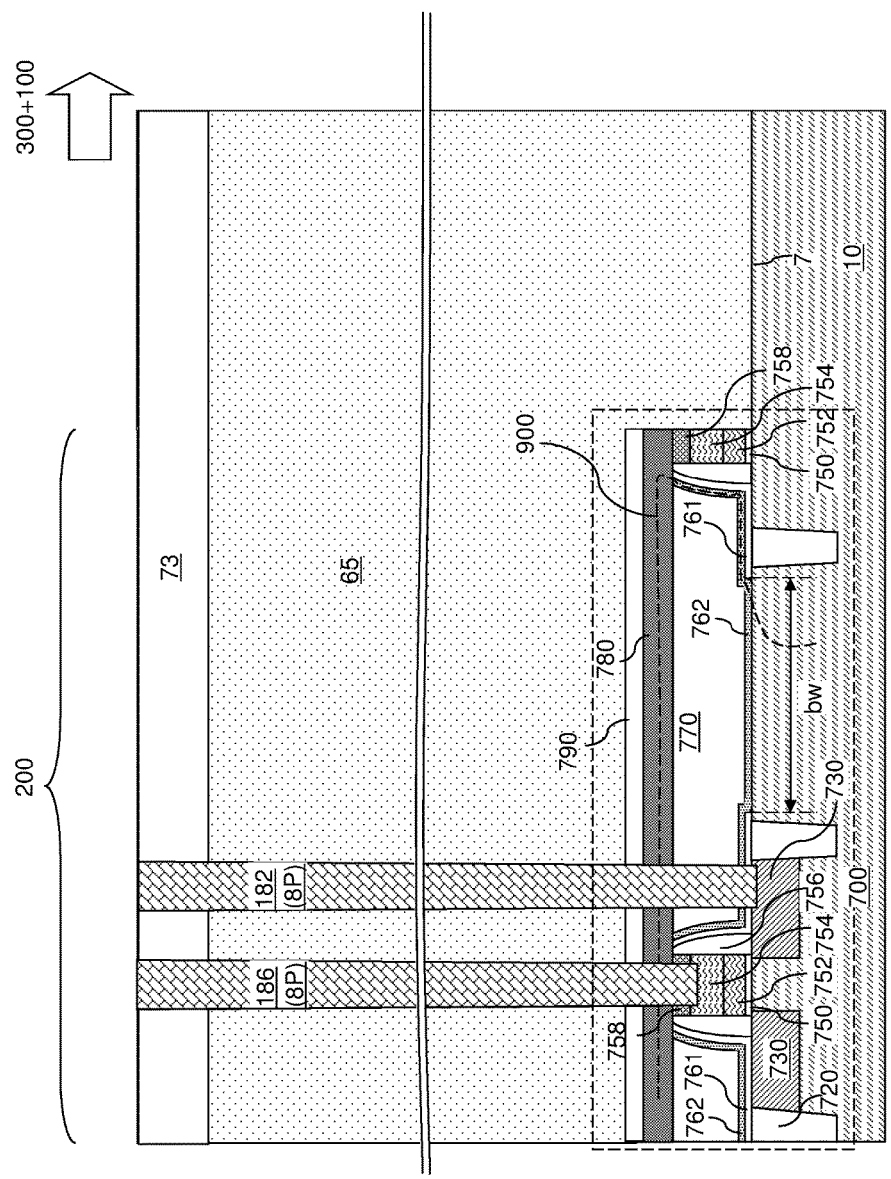
FIG. 26 is a vertical cross-sectional view of the peripheral device region of the exemplary structure after formation of peripheral contact via structures according to an embodiment of the present disclosure.
Figure 27:
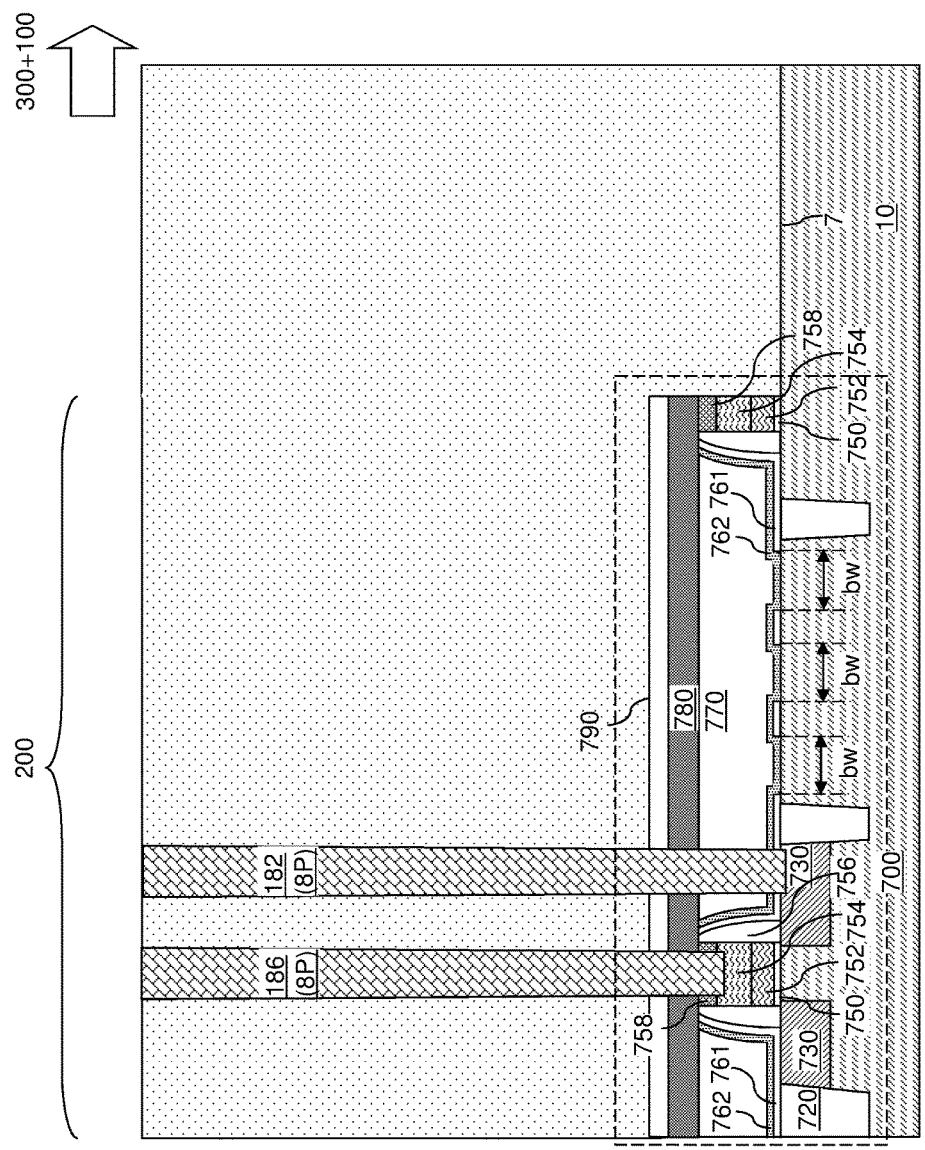
FIG. 27 is a vertical cross-sectional view of the peripheral device region of the first alternative configuration of the exemplary structure at the processing steps of FIG. 26 according to an embodiment of the present disclosure.
Figure 28:
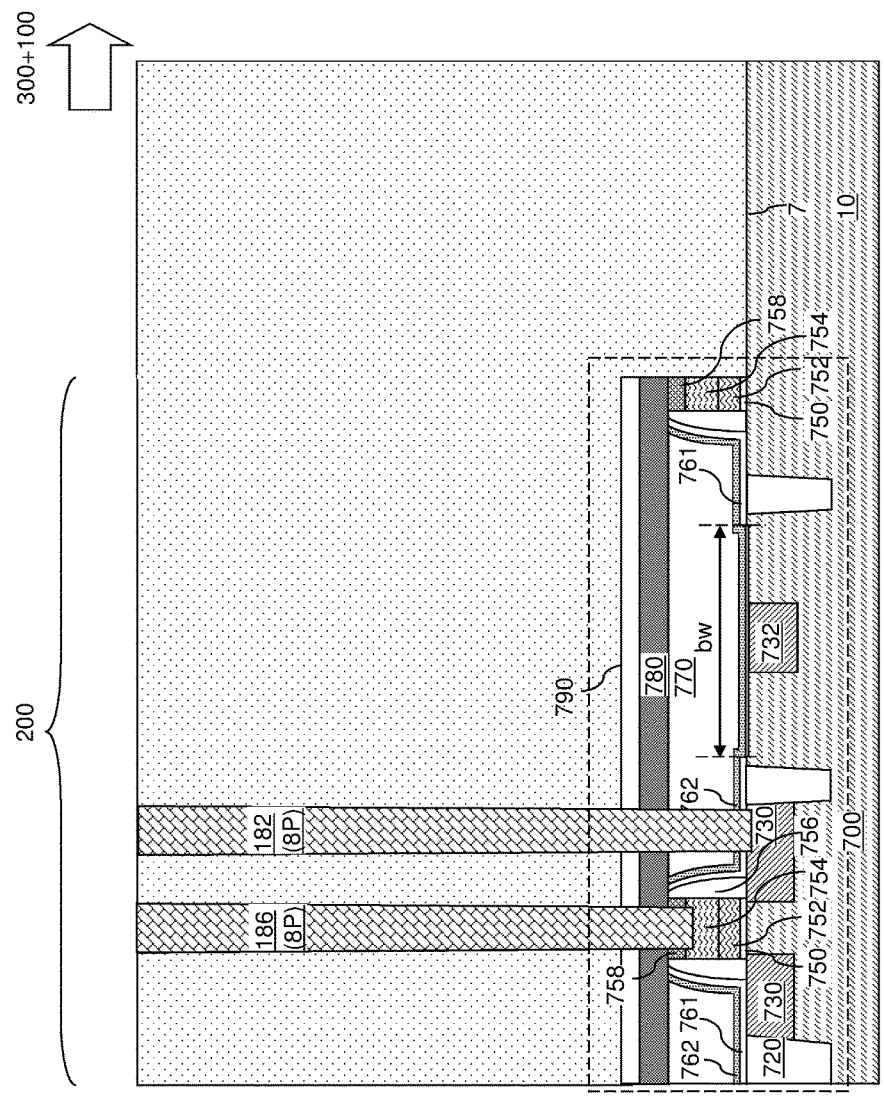
FIG. 28 is a vertical cross-sectional view of the peripheral device region of the second alternative configuration of the exemplary structure at the processing steps of FIG. 26 according to an embodiment of the present disclosure.

A processing sequence that can be employed to form the peripheral device contact via structures 8P is illustrated in FIGS. 24-26.

Referring to FIG. 24, peripheral device contact via cavities (181, 185) can be formed through the retro-stepped dielectric material portion 65, the optional etch stop layer 790, and the silicon nitride diffusion barrier layer 780, and into an underlying dielectric material portion. The peripheral device contact via cavities (181, 185) can include a gate contact via cavity 185 that extends into an upper portion of a gate cap silicon nitride portion 758, and an active region contact via cavity 181 that extends through the planarization silicon oxide layer 770 and the silicon nitride liner 762. The peripheral device contact via cavities (181, 185) can be formed by applying and patterning a photoresist layer (not shown) over the exemplary structure and lithographically patterning openings in the photoresist layer, and subsequently transferring the pattern of the openings in the photoresist layer through underlying dielectric material portions employing an anisotropic etch process. The silicon nitride diffusion barrier layer 780 can be employed as an etch stop layer during extension of the peripheral device contact via cavities (181, 185) through the retro-stepped dielectric material portion 65 and the optional etch stop layer 790, and the silicon nitride liner 762 can be employed as an etch stop layer during extension of the active region contact via cavity 181 through the planarization silicon oxide layer 770.

Referring to FIG. 25, the peripheral device contact via cavities (181, 185) are further vertically extended downward by extension of the anisotropic etch process. In one embodiment, the etching step shown in FIG. 25 occurs after removal of the sacrificial silicon nitride layers 42 shown in FIG. 18 to reduce the likelihood that hydrogen from the sacrificial silicon nitride layers 42 diffuses into the gate electrodes (752, 754) and the active regions 730 of the field effect transistors 702. The gate contact via cavity 185 extends through the gate cap silicon nitride portion 758 into an upper portion of a gate electrode (752, 754). The active region contact via cavity 181 extends through the silicon nitride liner 762 and the silicon oxide liner 761 to expose the active regions 730.

Referring to FIG. 26, at least one conductive material can be deposited in the peripheral device contact via cavities (181, 185). The at least one conductive material can include, for example, a metal nitride liner material such as titanium nitride and a metal fill material such as tungsten. Excess portions of the at least one conductive material overlying the top surface of the contact level dielectric layer 73 can be removed, for example, by a recess etch. A remaining portion of the at least one conductive material in the gate contact via cavity 185 constitutes a gate contact via structure 186, and a remaining portion of the at least one conductive material in the active region contact via cavity 181 constitutes an active region contact via structure 182. The gate contact via structure 186 and the active region contact via structure 182 are peripheral contact via structures 8P. While only two peripheral contact via structures 8P are illustrated herein, it is understood that multiple instances of the gate contact via structure 186 and the active region contact via structure 182 can be formed.

Referring to FIGS. 27-30, the peripheral device region 200 is shown for various alternative configurations of the exemplary structure, such as the alternative configurations of FIGS. 8-11, at the processing steps of FIG. 26.

Referring to all drawings and according to various embodiments of the present disclosure, a semiconductor structure is provided, which comprises: a field effect transistor located on a semiconductor substrate 10, a silicon oxide liner 761 contacting at least a portion of the semiconductor substrate 10, such as at least portions of top surfaces of active regions 730 in the semiconductor substrate; a silicon nitride liner 762 contacting a top surface and a sidewall of the silicon oxide liner 761 and contacting a top surface of the semiconductor substrate 10 in a seal region; a silicon nitride diffusion barrier layer 780 including a planar bottom surface that contacts top surfaces of vertically extending portions of the silicon nitride liner 762 (such as portions that overlie gate spacers 756); and a silicon oxide material portion (such as a retro-stepped dielectric material portion 65) overlying the silicon nitride diffusion barrier layer 780. A combination of the silicon nitride liner 762 and the silicon nitride diffusion barrier layer 780 constitutes a hydrogen diffusion barrier structure that continuously extends from the seal region and over the field effect transistor 702.

In one embodiment, at least one contact via structure (182, 186) can extend through the silicon oxide material portion (such as the retro-stepped dielectric material portion 65) and the silicon nitride diffusion barrier layer 780, and can contact one of a gate electrode (752, 754) and the active regions 730 of the field effect transistor.

A silicon oxide planarization layer 770 can be located between the silicon nitride liner 762 and the silicon nitride diffusion barrier layer 780, and can laterally surround the gate electrode of the field effect transistor. The at least one contact via structure (182, 186) can comprise an active region contact via structure 182 that extends through the silicon oxide planarization layer 770, the silicon nitride liner 762, and the silicon oxide liner 761 and contacts the active region 730.

A gate cap silicon nitride portion 758 can overlie the gate electrode (752, 754). The at least one contact via structure (182, 186) can comprise a gate contact via structure 186 that extends through the gate cap silicon nitride portion 758 and contacts the gate electrode (752, 754) of the field effect transistor. In one embodiment, the gate cap silicon nitride portion 758 consists essentially of silicon nitride and contacts a bottom surface of the silicon nitride diffusion barrier layer 780 and a top surface of the gate electrode (752, 754). In one embodiment, sidewalls of the gate cap silicon nitride portion 758 are vertically coincident with sidewalls of the gate electrode (752, 754) of the field effect transistor.

In one embodiment, the hydrogen diffusion barrier structure reduces or prevents diffusion of hydrogen from the silicon oxide material portion 65 into the field effect transistor 702. The silicon oxide liner 761 contacts at least portions of top surfaces of active regions 730 of the field effect transistor 702. The seal region 781 laterally surrounds a device region including the field effect transistor. The semiconductor substrate 10 and the combination of the silicon nitride liner 762 and the silicon nitride diffusion barrier layer 780 collectively encapsulate the field effect transistor.

Figure 29:
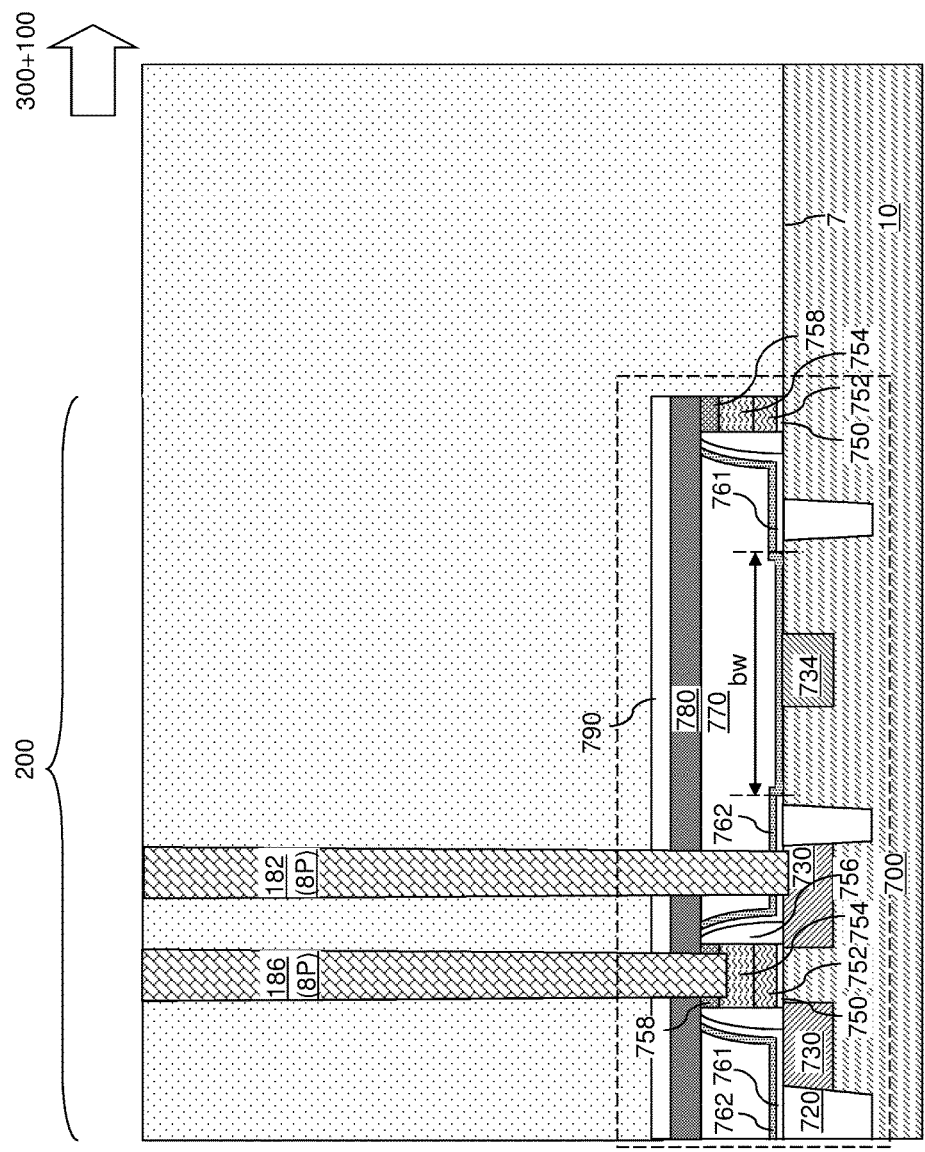
FIG. 29 is a vertical cross-sectional view of the peripheral device region of the third alternative configuration of the exemplary structure at the processing steps of FIG. 26 according to an embodiment of the present disclosure.
Figure 30:
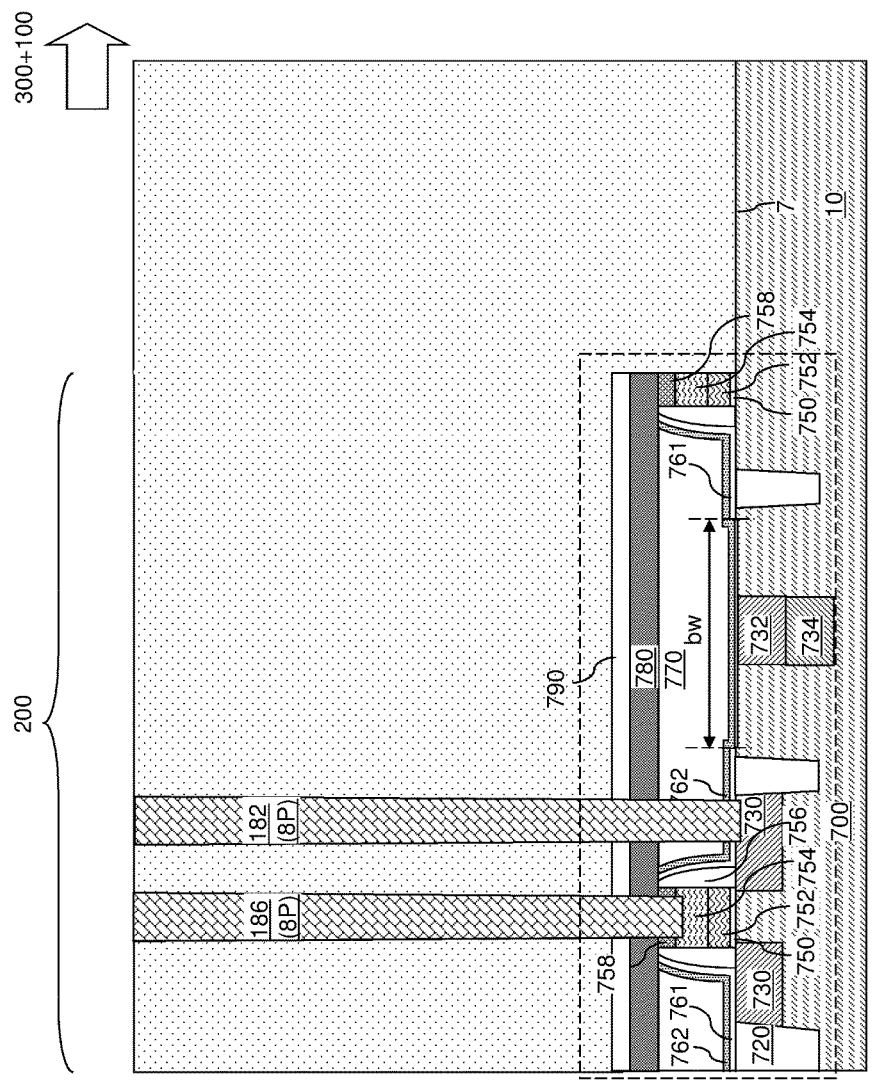
FIG. 30 is a vertical cross-sectional view of the peripheral device region of the fourth alternative configuration of the exemplary structure at the processing steps of FIG. 26 according to an embodiment of the present disclosure.

The semiconductor structure can further comprise at least one silicon oxide strip 761 (i.e., an annular patterned portion of the silicon oxide layer 761 illustrated in FIGS. 8 and 29) having a same composition and a thickness as the silicon oxide layer 761 and laterally spaced from an outer edge of the silicon oxide liner 761 by a respective distance. The silicon nitride liner 762 overlies the at least one silicon oxide strip 761 and contacts the semiconductor substrate 10 on both sides of each of the at least one silicon oxide strip 761.

In some embodiments, the semiconductor structure can comprise an electrically doped semiconductor region (732 or 734) embedded within the semiconductor substrate 10, laterally spaced from the silicon oxide liner 761, and contacting a bottom surface of the silicon nitride liner 762. The electrically doped semiconductor region (732 or 734) can be doped with at least one of boron, phosphorus, and arsenic. In one embodiment, the semiconductor structure can further comprise an electrically doped buried semiconductor region 734 contacting a bottom surface of the electrically doped semiconductor region 732, wherein the electrically doped semiconductor region 732 is silicon doped with at least one of phosphorus and arsenic, and the electrically doped buried semiconductor region 734 is silicon doped with boron.

In some embodiments, the semiconductor structure can further comprise a dummy gate stack structure 704 located on the semiconductor substrate 10 and is laterally spaced from the field effect transistor by the seal region, wherein a vertically extending portion of the silicon nitride liner 762 extends along an outer sidewall of a gate spacer 756 located on one side of the dummy gate stack structure 704 and contacts the silicon nitride diffusion barrier layer 780.

In one embodiment, the semiconductor structure further comprises a three-dimensional memory structure located on the semiconductor substrate 10 and including memory stack structures 55 that vertically extend through an alternating stack of insulating layers 32 and electrically conductive layers (e.g., word line layers) 46 and respectively include a memory film 50 and a vertical semiconductor channel 60. The three-dimensional memory structure is laterally spaced from the field effect transistor 702 by the silicon oxide material portion, such as the retro-stepped dielectric material portion 65.

According to another aspect of the present disclosure, a semiconductor structure is provided, which comprises: a field effect transistor located on a semiconductor substrate 10 in a substrate 8; a silicon oxide liner 761 contacting top surfaces of active regions 730 of the field effect transistor; a silicon nitride liner 762 contacting a top surface and a sidewall of the silicon oxide liner 762; a gate cap dielectric 758 overlying a gate electrode (752, 754) of the field effect transistor; a silicon nitride diffusion barrier layer 780 including a planar bottom surface that contacts top surfaces of vertically extending portions of the silicon nitride liner 762 and a top surface of the gate cap dielectric 758; a silicon oxide material portion (such as a retro-stepped dielectric material portion 65) overlying the silicon nitride diffusion barrier layer 780; and a gate contact via structure 186 that extends through the silicon nitride diffusion barrier layer 780 and the gate cap dielectric 758 and contacts the gate electrode (752, 754) of the field effect transistor.

A silicon oxide planarization layer 770 can be located between the silicon nitride liner 762 and the silicon nitride diffusion barrier layer 780, and can laterally surround the gate electrode (752, 754) of the field effect transistor, such that the silicon nitride liner 762 contacts a top surface of the semiconductor substrate 10 in a seal region. In one embodiment, the gate cap dielectric 758 comprises a gate cap silicon nitride portion. In other embodiments, the gate cap dielectric 758 can comprise other insulating materials, such as silicon oxide or silicon oxynitride.

Generally, hydrogen can easily diffuse into a peripheral device region 200 containing the CMOS semiconductor driver circuit devices 700 through silicon oxide layers. A silicon oxide liner 761 can be formed on top surfaces of active regions 730 to prevent or reduce excessive interfacial states. If direct contact between silicon oxide and a semiconductor material can be provided at the active regions 730 of field effect transistors 702, then the silicon oxide provides hydrogen diffusion paths to the field effect transistors 702. By providing direct contact between the silicon nitride liner 762 and the semiconductor substrate 10 outside the field effect transistor 702 areas (e.g., outside CMOS device areas), a seal region 781 that effectively blocks hydrogen diffusion is provided around a memory array region 100 or around the peripheral device region 200. Generally, any configuration that seals the source of hydrogen diffusion (such as the memory array region 100) with an annular seal region 781 and/or seals the destination of hydrogen diffusion (such as the peripheral device region 200) with the annular seal region 781 can be employed. Silicon nitride diffusion barrier layer thickness and/or barrier width "bw" of 30 nm or more should sufficiently block hydrogen diffusion and sufficiently reduce or prevent hydrogen diffusion into the field effect transistors 702. A greater barrier width and/or a nested configuration of multiple seal regions can further enhance the hydrogen blocking effect of the seal structure in the seal region 781 of the embodiments of the present disclosure.

While direct contact between the silicon nitride layer 762 and the semiconductor substrate 10 in the seal region 781 is effective as a hydrogen-blocking structure, complete removal of silicon oxide from the surface of the semiconductor substrate 10 may be difficult in some cases due to formation of native silicon oxide in common ambient conditions. In this case, formation of at least one electrically doped semiconductor region (732, 734) can be employed to enhance the hydrogen-blocking effect at the top surface of the semiconductor substrate 10 that underlies the silicon nitride liner 762. For example, arsenic, phosphorus, and/or boron can be employed to form the at least one electrically doped semiconductor region (732, 734). The dose of ions for the ion implantation process can be on the order of $1.0 \times 10^{15}/cm^2$. Thus, the ion implantation process that forms the active regions 730 (i.e., the source regions and the drain regions) of the field effect transistors can be employed to form the at least one electrically doped semiconductor region (732, 734) in some embodiments.

According to an aspect of the present disclosure, the ion species employed to form the at least one electrically doped semiconductor region (732, 734) can be selected depending on the thickness of any interfacial silicon oxide between the semiconductor substrate 10 and the silicon nitride liner 762. For example, if a thin silicon oxide layer (such as a native oxide layer) having a thickness in a range from 0.1 nm to 1 nm is present between the semiconductor substrate 10 and the silicon nitride liner 762, the inventors of the present disclosure observed that P and As atoms inside silicon oxide materials function as hydrogen trap sites. In this case, implantation of P and/or As into the semiconductor substrate 10 enhances hydrogen blocking effect underneath the silicon oxide interfacial layer. Thus, complete removal of surface silicon oxide (such as native silicon oxide) is not needed, and the hydrogen-blocking structure including a n-doped semiconductor region 734 is effective against hydrogen diffusion. In other words, the effect of residual interfacial silicon oxide is minimal as far as effectiveness of the hydrogen-blocking structure is concerned. The n-type dopants can be implanted simultaneously with formation of n-doped active regions, which can be performed prior to formation of the silicon oxide liner 761.

In case the interfacial silicon oxide material is completely removed, the silicon nitride liner 762 is formed directly on a top surface of the semiconductor substrate 10. The inventors of the present disclosure observed that boron atoms in a silicon substrate function as hydrogen traps. A p-doped semiconductor region 732 can be formed directly underneath the interface between the semiconductor substrate 10 and the silicon nitride liner 762 to enhance the hydrogen-blocking effect of the hydrogen diffusion barrier structure. The p-type dopants can be implanted simultaneously with formation of p-doped active regions, which can be performed prior to formation of the silicon oxide liner 761.

A combination of a shallow As or P implantation process and a deep B implantation process can be employed to form a vertical stack of two electrically doped semiconductor regions (732, 734). Hydrogen diffusion through a shallow region of the semiconductor substrate 10 and any remaining surface oxide portion can be blocked by a diffusion barrier region including phosphorus-doped silicon or arsenic-doped silicon. Hydrogen-diffusion through a deep region of the semiconductor substrate 10 can be blocked by another diffusion barrier region including boron-doped silicon. In this case, boron atoms can be implanted at a dose of about $1.0 \times 10^{13}/cm^2$ at a greater depth than the depth into which arsenic atoms and/or phosphorus atoms are implanted at a higher dose (such as $1.0 \times 10^{15}/cm^2$). The p-type dopants and/or the n-type dopants may be implanted simultaneously with formation of p-doped active regions and/or n-doped active regions and may be performed prior to formation of the silicon oxide liner 761.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate 10 can comprise a silicon substrate. The vertical NAND memory device can comprise an array of monolithic three-dimensional NAND strings over the silicon substrate. At least one memory cell (such as a portion of a charge storage layer 54 at a level of an electrically conductive layer 46) in a first device level of the array of monolithic three-dimensional NAND strings can be located over another memory cell (such as another portion of the charge storage layer 54 at a level of another electrically conductive layer 46) in a second device level of the array of monolithic three-dimensional NAND strings. The silicon substrate can contain an integrated circuit comprising a driver circuit (such as the least one semiconductor device 700) for the memory device located thereon. The electrically conductive layers 46 can comprise a plurality of control gate electrodes having a strip shape extending substantially parallel to the top surface of the substrate 10, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate 10 and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising:
   a field effect transistor located on a semiconductor substrate;
   a silicon oxide liner contacting at least a portion of the semiconductor substrate;
   a silicon nitride liner contacting a top surface and a sidewall of the silicon oxide liner and contacting a top surface of the semiconductor substrate in a seal region;
   a silicon nitride diffusion barrier layer including a planar bottom surface that contacts top surfaces of vertically extending portions of the silicon nitride liner; and
   a silicon oxide material portion overlying the silicon nitride diffusion barrier layer, wherein a combination of the silicon nitride liner and the silicon nitride diffusion barrier layer constitutes a hydrogen diffusion barrier structure that continuously extends from the seal region and over the field effect transistor.

2. The semiconductor structure of claim 1, further comprising at least one contact via structure that extends through the silicon oxide material portion and the silicon nitride diffusion barrier layer and contacts one of a gate electrode and the active regions of the field effect transistor.

3. The semiconductor structure of claim 1, further comprising at least one silicon oxide strip having a same composition and a thickness as the silicon oxide layer and laterally spaced from an outer edge of the silicon oxide liner by a respective distance, wherein the silicon nitride liner overlies the at least one silicon oxide strip and contacts the semiconductor substrate on both sides of each of the at least one silicon oxide strip.

4. The semiconductor structure of claim 1, further comprising an electrically doped semiconductor region embedded within the semiconductor substrate in the seal region, laterally spaced from the silicon oxide liner, and contacting a bottom surface of the silicon nitride liner.

5. The semiconductor structure of claim 1, further comprising a dummy gate structure located on the semiconductor substrate and laterally spaced from the field effect transistor by the seal region, wherein a vertically extending portion of the silicon nitride liner extends along an outer sidewall of a gate spacer located on one side of the dummy gate and contacts the silicon nitride diffusion barrier layer.

6. The semiconductor structure of claim 1, further comprising a three-dimensional memory structure located on the semiconductor substrate and including memory stack structures that vertically extend through an alternating stack of insulating layers and electrically conductive word line layers and respectively include a memory film and a vertical semiconductor channel, wherein the three-dimensional memory structure is laterally spaced from the field effect transistor by the silicon oxide material portion.

7. The semiconductor structure of claim 2, further comprising a silicon oxide planarization layer located between the silicon nitride liner and the silicon nitride diffusion barrier layer and laterally surrounding the gate electrode of the field effect transistor, wherein the at least one contact via structure comprises an active region contact via structure that extends through the silicon oxide planarization layer, the silicon nitride liner, and the silicon oxide liner and contacts the active region.

8. The semiconductor structure of claim 2, further comprising a gate cap dielectric overlying the gate electrode, wherein the at least one contact via structure comprises a gate contact via structure that extends through the gate cap dielectric and contacts the gate electrode of the field effect transistor.

9. The semiconductor structure of claim 2, wherein:
   the hydrogen diffusion barrier structure reduces or prevents diffusion of hydrogen from the silicon oxide material portion into the field effect transistor;
   the silicon oxide liner contacts at least portions of top surfaces of active regions of the field effect transistor;
   the seal region laterally surrounds a device region including the field effect transistor; and
   the semiconductor substrate and the combination of the silicon nitride liner and the silicon nitride diffusion barrier layer collectively encapsulate the field effect transistor.

10. The semiconductor structure of claim 8, wherein the gate cap dielectric consists essentially of silicon nitride and contacts a bottom surface of the silicon nitride diffusion barrier layer and a top surface of the gate electrode.

11. The semiconductor structure of claim 10, wherein sidewalls of the gate cap dielectric are vertically coincident with sidewalls of the gate electrode of the field effect transistor.

12. The semiconductor structure of claim 4, further comprising an electrically doped buried semiconductor region contacting a bottom surface of the electrically doped semiconductor region, wherein the electrically doped semiconductor region is a silicon region doped with at least one of phosphorus and arsenic, and the electrically doped buried semiconductor region is a silicon region doped with boron.

13. A semiconductor structure comprising:
    a field effect transistor located on a semiconductor substrate;
    a silicon oxide liner contacting at least portions of top surfaces of active regions of the field effect transistor;
    a silicon nitride liner contacting a top surface and a sidewall of the silicon oxide liner;
    a gate cap dielectric overlying a gate electrode of the field effect transistor;
    a silicon nitride diffusion barrier layer including a planar bottom surface that contacts top surfaces of vertically extending portions of the silicon nitride liner and a top surface of the gate cap dielectric;
    a silicon oxide material portion overlying the silicon nitride diffusion barrier layer; and
    a gate contact via structure that extends through the silicon nitride diffusion barrier layer and the gate cap dielectric and contacts the gate electrode of the field effect transistor.

14. The semiconductor structure of claim 13, further comprising a silicon oxide planarization layer located between the silicon nitride liner and the silicon nitride diffusion barrier layer and laterally surrounding the gate electrode of the field effect transistor, wherein the silicon nitride liner contacts a top surface of the semiconductor substrate in a seal region and wherein the gate cap dielectric comprises a gate cap silicon nitride portion.

15. The semiconductor structure of claim 13, further comprising a three-dimensional memory structure located on the semiconductor substrate and including memory stack structures that vertically extend through an alternating stack of insulating layers and electrically conductive word line layers and respectively include a memory film and a vertical semiconductor channel, wherein the three-dimensional memory structure is laterally spaced from the field effect transistor by the silicon oxide material portion.

16. A method of forming a semiconductor structure, comprising:
   forming a field effect transistor on a semiconductor substrate, wherein the field effect transistor comprises active regions embedded in the semiconductor substrate and a gate electrode overlying the semiconductor substrate;
   forming a silicon oxide liner over the field effect transistor and on a top surface of the semiconductor substrate;
   forming at least one opening laterally enclosing an area through the silicon oxide liner, wherein the top surface of the semiconductor substrate is physically exposed within each of the at least one opening in the silicon oxide liner;
   forming a silicon nitride liner over the silicon oxide liner and on the top surface of the semiconductor substrate in a seal region defined between an inner periphery and an outer periphery of the at least one opening in the silicon oxide liner;
   forming a silicon oxide planarization layer including a planar top surface around the gate electrode and over portions of the silicon nitride liner that laterally surround the gate electrode;
   forming a silicon nitride diffusion barrier layer over the silicon oxide planarization layer and top surfaces of vertically extending portions of the silicon nitride liner; and
   forming a silicon oxide material portion over the silicon nitride diffusion barrier layer, wherein a combination of the silicon nitride liner and the silicon nitride diffusion barrier layer constitutes a hydrogen diffusion barrier structure that continuously extends from the seal region and over the field effect transistor.

17. The method of claim 16, further comprising:
   forming a gate cap dielectric on the gate electrode, wherein the silicon oxide liner is formed over the gate cap dielectric;
   forming an in-process planarization silicon oxide layer over the silicon nitride liner;
   removing portions of the in-process planarization silicon oxide layer, the silicon nitride liner, and from above a horizontal plane including a top surface of the gate cap dielectric, wherein the silicon nitride diffusion barrier layer is formed on the top surface of the gate cap dielectric; and
   forming at least one contact via structure through the silicon oxide material portion and the silicon nitride diffusion barrier layer and on one of the gate electrode and the active regions of the field effect transistor.

18. The method of claim 16, further comprising forming an electrically doped semiconductor region within the semiconductor substrate, wherein the electrically doped semiconductor region is laterally spaced from the silicon oxide liner, and contacts a bottom surface of the silicon nitride liner.

19. The method of claim 16, further comprising forming a dummy gate structure that laterally encloses a device region on the semiconductor substrate, wherein the at least one opening and the dummy gate structure provide a nested structure, and wherein a vertically extending portion of the silicon nitride liner extends along an outer sidewall of a gate spacer located on one side of the dummy gate and contacts the silicon nitride diffusion barrier layer.

20. The method of claim 16, further comprising forming a three-dimensional memory structure on the semiconductor substrate, wherein the three-dimensional memory structure comprises memory stack structures that vertically extend through an alternating stack of insulating layers and electrically conductive word line layers and respectively include a memory film and a vertical semiconductor channel, wherein the three-dimensional memory structure is laterally spaced from the field effect transistor by the silicon oxide material portion.

21. The method of claim 17, wherein:
   the gate cap dielectric comprises a gate cap silicon nitride portion;
   the gate cap dielectric and the gate electrode are formed by patterning a gate electrode layer and a gate cap silicon nitride layer by an anisotropic etch process that employs a same mask pattern;
   the silicon nitride diffusion barrier layer contacts an entire top surface of the gate cap dielectric;
   the seal region laterally surrounds a device region including the field effect transistor; and
   the semiconductor substrate and the combination of the silicon nitride liner and the silicon nitride diffusion barrier layer collectively encapsulate the field effect transistor.

* * * * *